(12) United States Patent
Lee et al.

(10) Patent No.: US 11,721,713 B2
(45) Date of Patent: Aug. 8, 2023

(54) IMAGE SENSORS

(71) Applicant: Samsung Electronics Co., Ltd., Suwon-si (KR)

(72) Inventors: Seungjoon Lee, Busan (KR); Kyungho Lee, Suwon-si (KR); Jungbin Yun, Hwaseong-si (KR); Junghyung Pyo, Seoul (KR)

(73) Assignee: Samsung Electronics Co., Ltd.

( * ) Notice: Subject to any disclaimer, the term of this patent is extended or adjusted under 35 U.S.C. 154(b) by 41 days.

(21) Appl. No.: 17/543,967

(22) Filed: Dec. 7, 2021

(65) Prior Publication Data
US 2022/0328548 A1    Oct. 13, 2022

(30) Foreign Application Priority Data

Apr. 9, 2021 (KR) .................. 10-2021-0046646

(51) Int. Cl.
*H01L 27/146* (2006.01)
*H01L 27/148* (2006.01)
(Continued)

(52) U.S. Cl.
CPC .. *H01L 27/14627* (2013.01); *H01L 27/14612* (2013.01); *H01L 27/14621* (2013.01);
(Continued)

(58) Field of Classification Search
CPC ......... H01L 27/14627; H01L 27/14612; H01L 27/14621; H01L 27/14645; H01L 27/14831; H01L 27/14603; H01L 27/1463; H01L 27/1464; H01L 27/14641; H04N 23/67; H04N 25/75; H04N 25/46; H04N 25/704; H04N 25/778; H04N 23/672; H04N 25/745
See application file for complete search history.

(56) References Cited

U.S. PATENT DOCUMENTS

| 10,200,593 | B2 | 2/2019 | Mochizuki et al. |
| 2013/0119234 | A1 | 5/2013 | Lee et al. |

(Continued)

FOREIGN PATENT DOCUMENTS

| JP | 2005175392 A | 6/2005 |
| JP | 2017194655 A | 10/2017 |

(Continued)

*Primary Examiner* — Shahbaz Nazrul
(74) *Attorney, Agent, or Firm* — Myers Bigel, P.A.

(57) ABSTRACT

An image sensor includes a pixel array including a plurality of pixel groups, each of the plurality of pixel groups including a plurality of unit pixels and sharing a single microlens, the plurality of unit pixels in each of the plurality of pixel groups including color filters of the same color, and a control logic configured to group the plurality of unit pixels of each of the plurality of pixel groups into a plurality of subgroups and to drive the pixel array for each subgroup. The plurality of subgroups include a first subgroup and a second subgroup. The control logic may be configured to obtain first image data corresponding to the first subgroup and second image data corresponding to the second subgroup, and the first subgroup and the second subgroup are provided with at least one unit pixel therebetween in the first direction or the second direction.

20 Claims, 38 Drawing Sheets

(51) Int. Cl.
*H04N 23/67* (2023.01)
*H04N 25/75* (2023.01)

(52) U.S. Cl.
CPC .. *H01L 27/14645* (2013.01); *H01L 27/14831* (2013.01); *H04N 23/67* (2023.01); *H04N 25/75* (2023.01)

(56) References Cited

U.S. PATENT DOCUMENTS

| | | | |
|---|---|---|---|
| 2017/0171470 A1* | 6/2017 | Sakioka | H04N 23/84 |
| 2017/0310877 A1 | 10/2017 | Takayama et al. | |
| 2019/0068930 A1 | 2/2019 | Kato | |
| 2019/0208118 A1* | 7/2019 | Jasinski | H04N 23/67 |
| 2019/0281226 A1* | 9/2019 | Wang | H04N 23/672 |
| 2020/0279881 A1 | 9/2020 | Jin et al. | |
| 2020/0314362 A1* | 10/2020 | Roh | H04N 25/778 |
| 2020/0328238 A1* | 10/2020 | Shim | H01L 27/1463 |
| 2020/0358971 A1* | 11/2020 | Shim | H04N 25/445 |
| 2021/0120168 A1* | 4/2021 | Shim | H04N 23/672 |
| 2021/0233950 A1* | 7/2021 | Jang | H04N 23/959 |

FOREIGN PATENT DOCUMENTS

| | | | |
|---|---|---|---|
| JP | 2017194656 A | 10/2017 |
| JP | 2018007205 A | 1/2018 |
| KR | 20130052986 A | 5/2013 |
| KR | 20200105584 A | 9/2020 |

\* cited by examiner

IMAGE SENSORS

CROSS-REFERENCE TO RELATED APPLICATION(S)

This application claims the benefit of priority under 35 U.S.C. § 119(a) to Korean Patent Application No. 10-2021-0046646, filed on Apr. 9, 2021, in the Korean Intellectual Property Office, and the entire contents of the above-identified application are incorporated herein by reference for all purposes.

BACKGROUND

The present inventive concepts relate to image sensors.

Image sensors are semiconductor-based sensors configured to receive light and generate electrical signals based on the received light. Image sensors may include pixel arrays having a plurality of pixels, control logic configured to drive pixel arrays and generate images, and other components. Such control logic may obtain pixel signals from pixels to generate image data. Some image sensors may provide autofocusing functionality to create images and/or focus on a subject.

SUMMARY

Some example embodiments of the inventive concepts according to the present disclosure provide an image sensor capable of providing autofocusing and distance data while all pixel groups included in a pixel array generate an image.

According to some example embodiments, an image sensor includes a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels in each of the plurality of pixel groups including color filters of the same color, and a control logic configured to group the plurality of unit pixels in each of the plurality of pixel groups into a plurality of subgroups and to drive the pixel array for each subgroup. In each of the plurality of pixel groups, the plurality of subgroups include a first subgroup and a second subgroup. The control logic is configured to obtain first image data corresponding to the first subgroup and second image data corresponding to the second subgroup, and the first subgroup and the second subgroup are provided with at least one unit pixel therebetween in the first direction or the second direction.

According to some example embodiments, an image sensor includes a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels in each of the plurality of pixel groups including color filters of the same color, and a control logic configured to group the plurality of unit pixels in each of the plurality of pixel groups into a plurality of subgroups and to adjust differently on and off timings of a plurality of transfer transistors included in the unit pixels for each subgroup. In each of the plurality of pixel groups, the plurality of subgroups include a first subgroup and a second subgroup, and at least one unit pixel is between the first subgroup and the second subgroup in the first direction or the second direction.

According to some example embodiments, an image sensor may include a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels in each of the plurality of pixel groups including color filters of the same color, and a control logic configured to group the plurality of unit pixels in each of the plurality of pixel groups into a plurality of subgroups and to drive the pixel array for each subgroup. In each of the plurality of pixel groups, a first device isolation layer is between the plurality of unit pixels in each of the plurality of pixel groups, the plurality of subgroups include a first subgroup and a second subgroup, and the first subgroup and the second subgroup are provided with at least one unit pixel therebetween in the first direction or the second direction.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Photodiodes may react to light to create electrons or holes as primary charge carriers. In the present specification, a case in which the photodiode generates electrons as main charge carriers in response to light is provided as an example, with the understanding that the inventive concepts disclosed herein are not limited thereto.

Hereinafter, some example embodiments of the inventive concepts of the present disclosure will be described with reference to the accompanying drawings.

Figure 1:
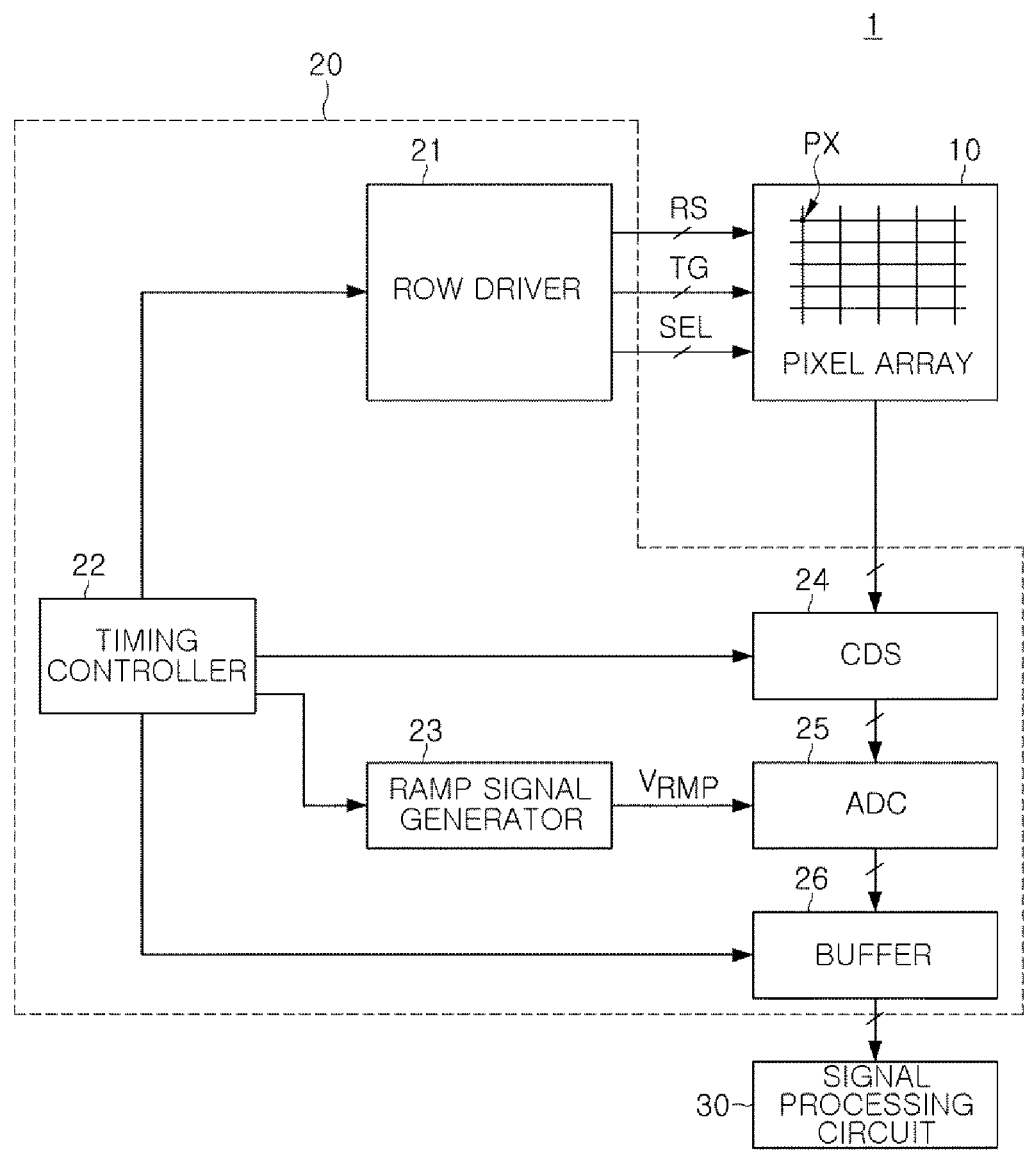
FIG. 1 is a block diagram illustrating an image sensor according to some example embodiments.

FIG. 1 is a block diagram illustrating an image sensor according to some example embodiments.

Referring to FIG. 1, an image sensor 1 according to some example embodiments may include a pixel array 10 and control logic 20. The control logic 20 may include a row driver 21, a timing controller 22, a ramp signal generator 23, a sampling circuit 24, an analog-to-digital converter (ADC) 25, and a buffer 26. The ramp signal generator 23, the sampling circuit 24, the analog-to-digital converter (ADC) 25, and the buffer 26 may be defined as a readout circuit.

The image sensor 1 may generate image data by converting light received from an externals source into an electrical signal. The pixel array 10 included in the image sensor 1 may include a plurality of pixels PX, and each of the plurality of pixels PX may include a photoelectric device, for example, a photo diode (PD), configured to receive light and generate an electric charge based on the received light. The plurality of pixels PX may be connected to a plurality of row lines that extend in a first direction and a plurality of column lines that extend in a second direction. The second direction may intersect the first direction. A plurality of pixels PX adjacent to each other in at least one of the first direction and the second direction may constitute a pixel group, and the pixels PX of a pixel group may be referred to herein as unit pixels.

Each of the plurality of pixels PX may include a pixel circuit configured to generate a pixel signal from charges generated by the photodiodes. In some example embodiments, a pixel circuit may include a transfer transistor, a driving transistor, a selection transistor, a reset transistor, a floating diffusion region, and other components. The pixel circuit may output a reset voltage and a pixel voltage. The pixel voltage may be a voltage that corresponds to charges generated by the photodiodes included in each of the plurality of pixels PX and stored in the floating diffusion region. In an example embodiment, two or more unit pixels PX included in the same pixel group may share at least a portion of a transfer transistor, a driving transistor, a selection transistor, and/or a reset transistor.

The row driver 21 may drive the pixel array 10 by inputting driving signals to the plurality of row lines. For example, the driving signal may include transfer control signals TG for controlling the transfer transistors of the pixel circuits, reset control signals RS for controlling the reset transistors, selection control signals SEL for controlling the selection transistors, and other signals. In some embodiments, the row driver 21 may sequentially drive a plurality of row lines (e.g., drive a first row line of the plurality of row lines, then drive a second row line of the plurality of row lines, and so on).

The sampling circuit 24 may include a plurality of samplers connected to the pixels PX through a plurality of column lines, and in some example embodiments, the sampler may be a correlated double sampler (CDS). The sampler may detect the reset voltage and the pixel voltage from the pixels PX connected to a selected row line among the plurality of row lines. The selected row line may be driven by the row driver 21. The samplers may output a difference between the reset voltage and the pixel voltage as an analog signal.

The analog-to-digital converter 25 may compare an analog signal with a ramp voltage $V_{RMP}$, convert result of the comparison into a digital signal, and output the converted signal as image data. The image data may have a value that increases as the difference between the reset voltage and the pixel voltage increases. Accordingly, the image data may have a value that increases as the amount of light received by the photodiode increases.

The buffer 26 may temporarily store the image data received from the analog-to-digital converter 25.

Each component of the control logic 20 may be controlled by a timing controller 22. The timing controller 22 may control operation timings of the row driver 21 and the readout circuit. The row driver 21 may control the operation of the pixel array 10 on a row-by-row basis (or in units of rows) according to the control of the timing controller 22.

A signal processing circuit 30 may generate an image using the image data transmitted from the buffer 26 and/or may provide autofocusing and distance data.

According to some example embodiments and as discussed above, a plurality of unit pixels PX adjacent to each other in at least one of the first direction and the second direction may constitute a pixel group. The unit pixels PX within one pixel group may include color filters of the same color and/or may share a single microlens. Accordingly, all pixel groups included in the pixel array 10 may be used to provide autofocusing and distance data while generating an image. Therefore, an image having high sensitivity may be generated while providing autofocusing and distance data in or for all pixels.

Figure 2:
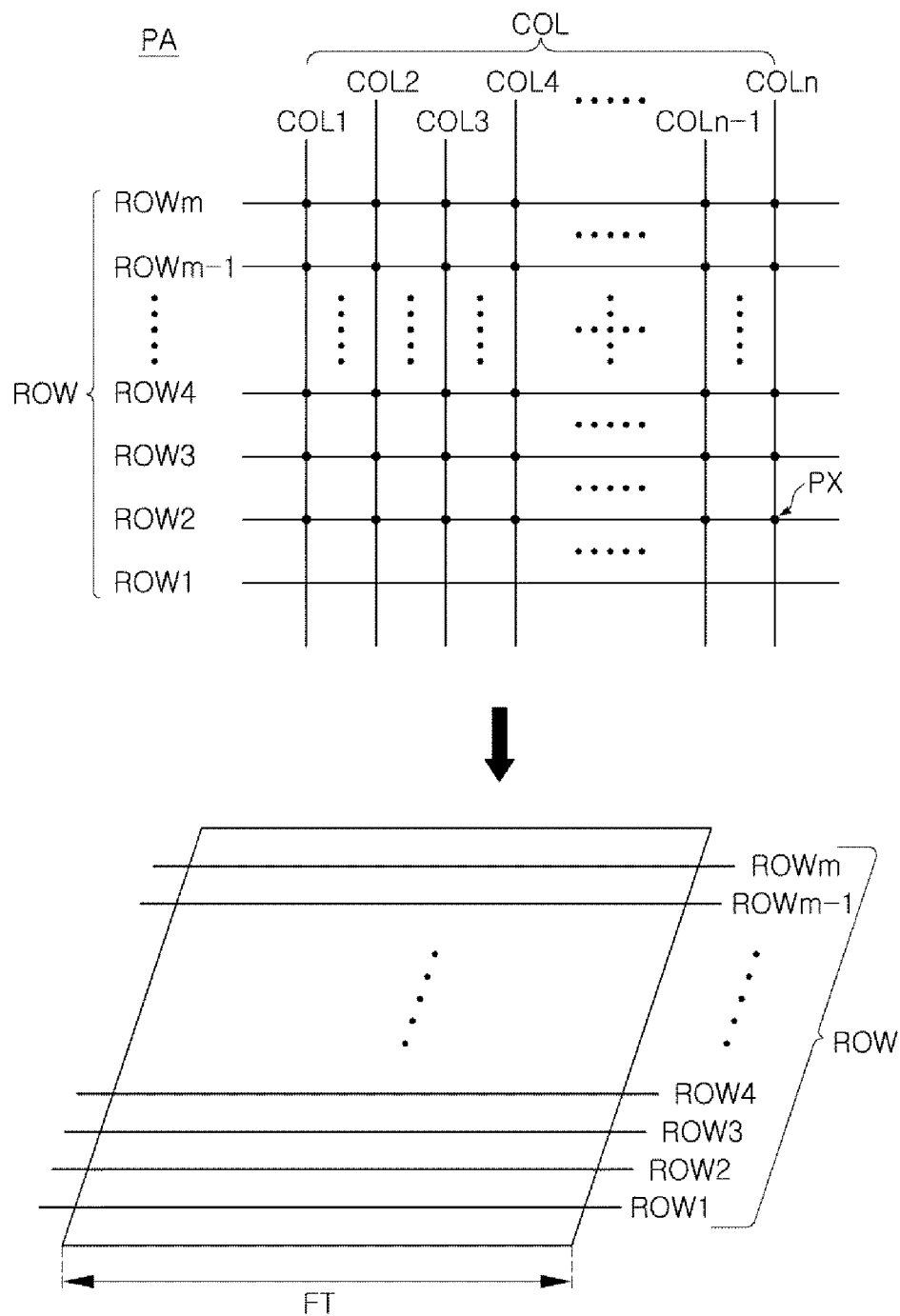
FIG. 2 is a diagram illustrating an operation of an image sensor according to some example embodiments.

FIG. 2 is a diagram illustrating an operation of an image sensor according to some example embodiments.

Referring to FIG. 2, a pixel array PA of an image sensor according to some example embodiments may include a plurality of pixels PX. The plurality of pixels PX may be connected to a plurality of row lines ROW1-ROWm (ROW) and a plurality of column lines COL1-COLn (COL). Each pixel may be connected to one of the plurality of row lines and one of the plurality of column lines. The image sensor may drive the plurality of pixels PX in row units of the plurality of row lines ROW, or in other words on a row-by-row basis. A time required to drive the selection driving line of a selected row among the plurality of row lines ROW and to read the reset voltage and the pixel voltage from the pixels PX connected to the selection driving line of the selected may be defined as one horizontal period. The image sensor may operate in a rolling shutter method of sequentially driving the plurality of row lines ROW.

A frame period FT of the image sensor may be defined as the times required to read the reset voltage and the pixel voltage from all pixels included in the pixel array PA. For example, the frame period FT may be equal to or greater than a product of the number of the plurality of row lines ROW and the horizontal period. As the frame period FT of the image sensor is shorter, the image sensor may generate a larger number of image frames during the same time period.

Figure 3:
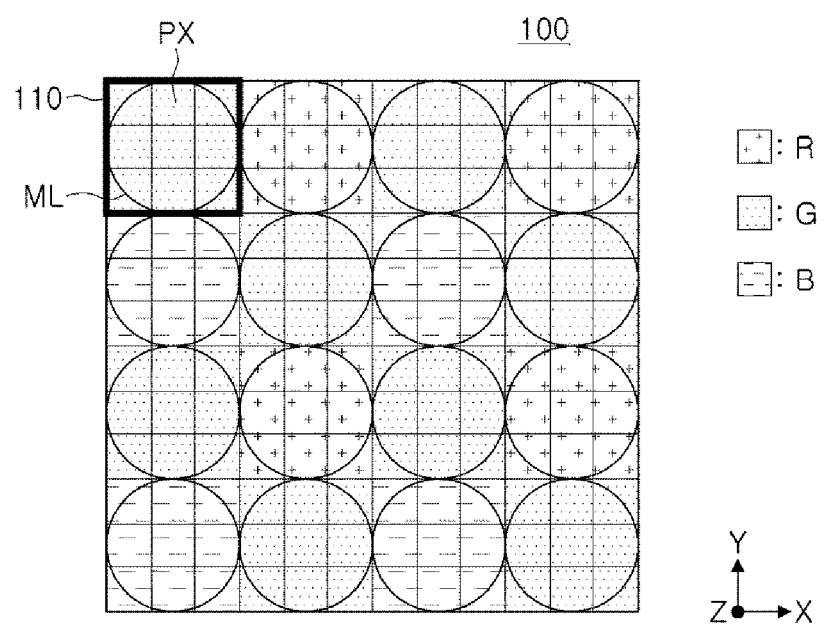
FIG. 3 is a diagram illustrating a pixel array of an image sensor according to some example embodiments.

FIG. 3 is a diagram illustrating a pixel array of an image sensor according to some example embodiments. Referring to FIG. 3, a pixel array 100 of the image sensor according to some example embodiments may include a plurality of unit pixels PX arranged in the first direction, e.g., an X-axis direction, and the second direction that intersects or crosses the first direction, and a plurality of unit pixels adjacent to each other in at least one of the first direction and the second direction may constitute a pixel group 110. FIG. 3 illustrates only some of the plurality of pixels included in the image sensor, and the number of the plurality of pixels included in the image sensor may be variously changed according to the plate shape and resolution of the image sensor.

Hereinafter, some example embodiments in which each of the plurality of pixel groups 110 includes first to ninth unit pixels PX will be described.

Referring to FIG. 3, the first to ninth unit pixels PX in one pixel group 110 may share a single microlens ML. Although not shown, the ninth unit pixels may each include a color filter having the same color as each other. Each of the first to ninth unit pixels may include at least one photodiode, and at least some of the first to ninth unit pixels may share one floating diffusion region.

Figure 20A:
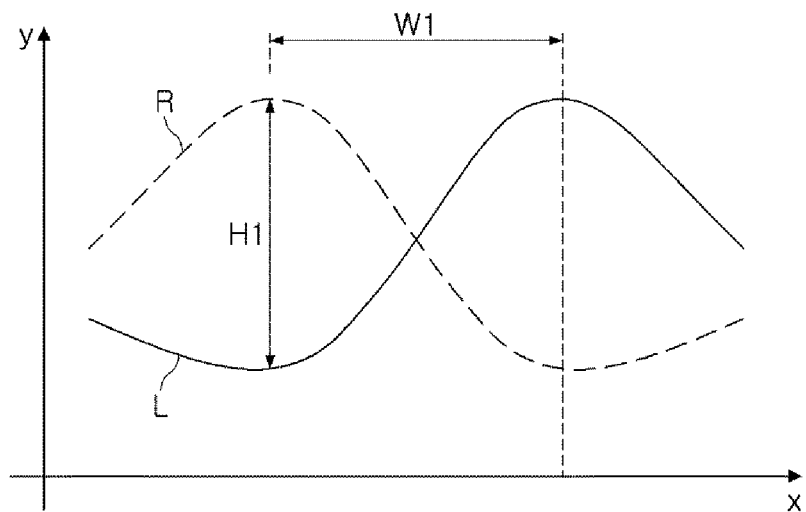
FIG. 20A is a diagram illustrating a comparative example to describe an effect of an image sensor according to some example embodiments of the present inventive concepts.
Figure 20B:
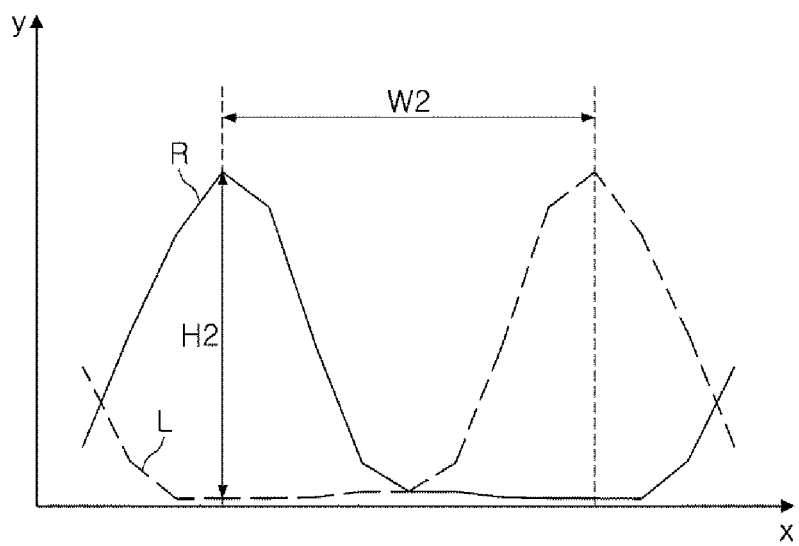
FIG. 20B is a diagram illustrating the effect of an image sensor according to some example embodiments of the present inventive concepts.
Figure 21:
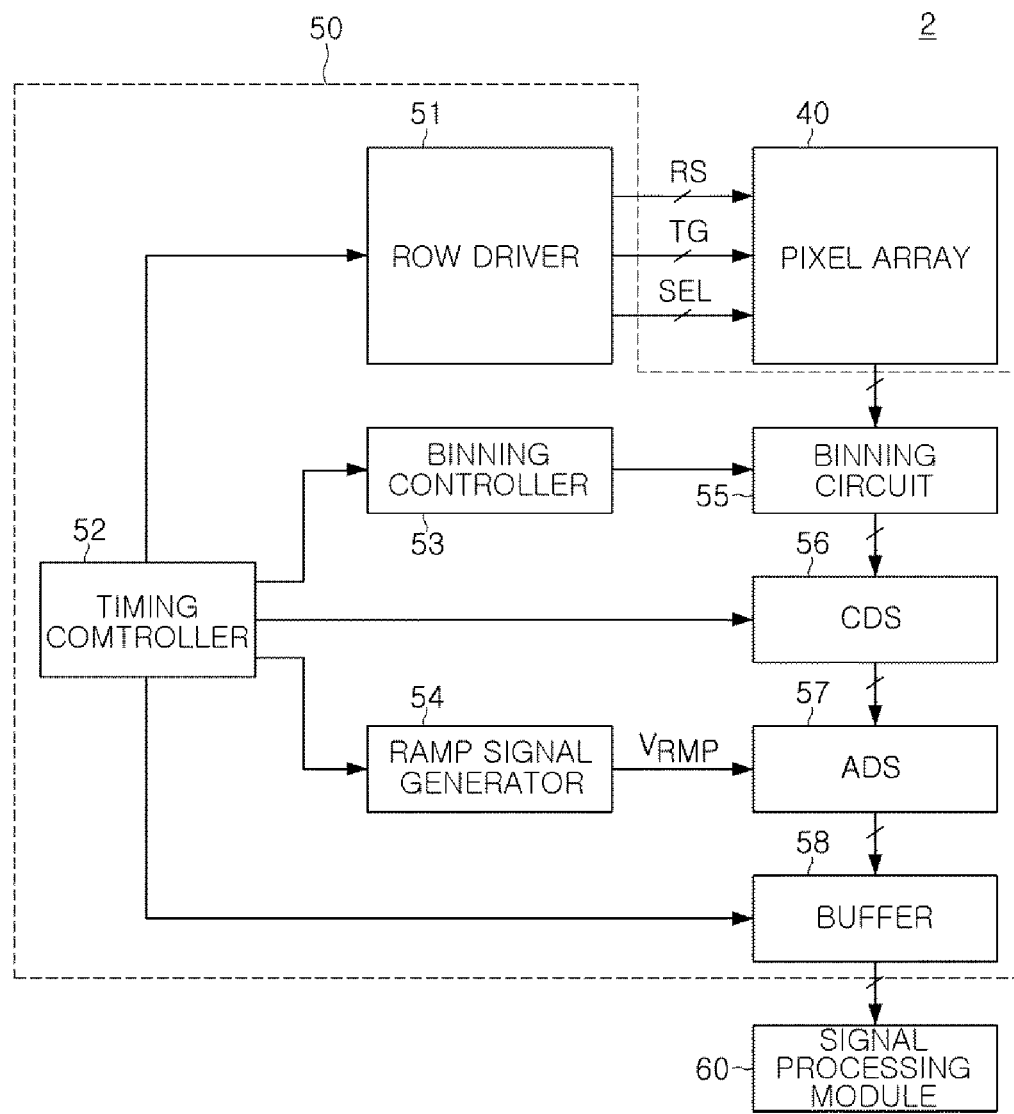
FIG. 21 is a block diagram illustrating an image sensor according to some example embodiments.
Figure 22:
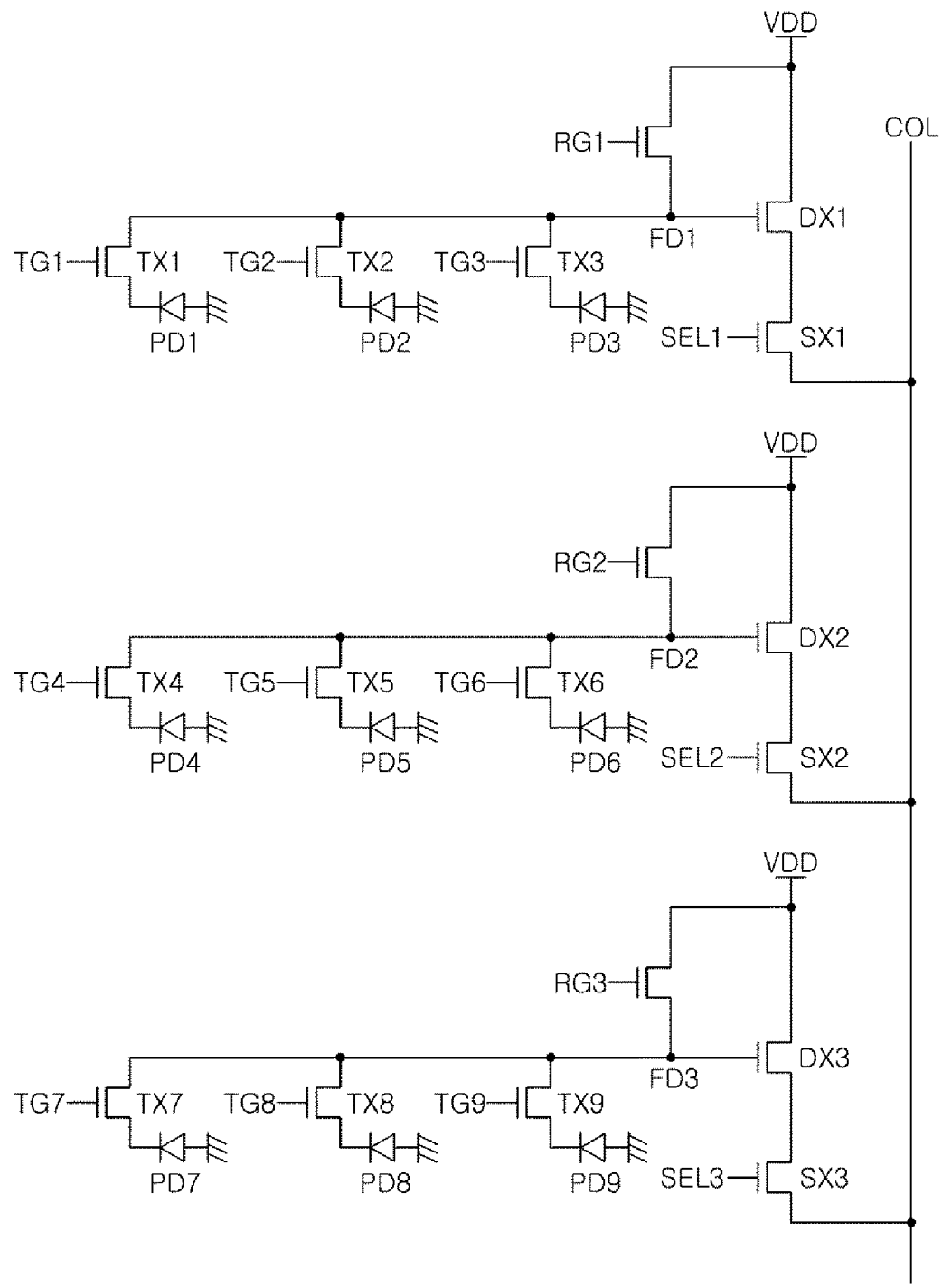
FIG. 22 is a diagram schematically illustrating a circuit of a pixel group included in an image sensor according to some example embodiments.

FIGS. 4 to 20 illustrate that in some example embodiments the first to ninth unit pixels may share one floating diffusion region, and FIGS. 21 and 22 illustrate that in some example embodiments a floating diffusion region may be shared by the unit pixels of subgroups of the first to ninth unit pixels.

Referring back to FIG. 3, the image sensor may include a device isolation layer (not shown) between the unit pixels PX. A plurality of pixel groups may be optically separated from each other by the device isolation layer. In addition, a plurality of unit regions in which photodiodes of the unit pixels PX are formed in one pixel group may be defined by the device isolation layer. In some example embodiments, a charge overflow barrier (COB) (not shown) may be formed between the unit pixels PX. Charges may move between the photodiodes of one pixel group through the COB. The COB may be an impurity region having a PN junction structure.

As a comparative example, in the case of a 2-PD image sensor having two photodiodes in one pixel, an auto-focus function may be provided in all pixels, but miniaturization may be difficult because the photodiodes within one pixel should be separated. In addition, when unit pixels that are arranged in a 2×2 form share a single microlens, accurate distance data may not be obtained because a sufficient distance between pixels for providing distance data and autofocusing may not be secured.

According to some example embodiments of the present inventive concept, since the first to ninth unit pixels PX in one pixel group 110 share a single microlens ML and include color filters of the same color, all the pixel groups included in the pixel array 100 may be used to provide autofocusing and distance data while generating an image. Therefore, an image having high or higher sensitivity may be generated while autofocusing and distance data are provided in or for all pixels. In addition, the image sensor may generate an image having a relatively high or higher resolution according to an operation mode and/or may generate an image having significantly increased sensitivity by using a COB.

In addition, since a need to separate the photodiodes within one pixel may be reduced or eliminated, the pixel may be significantly reduced, and since a distance between pixels for providing distance data and autofocusing may be secured, phase separation by light may be more effective.

Figure 4:
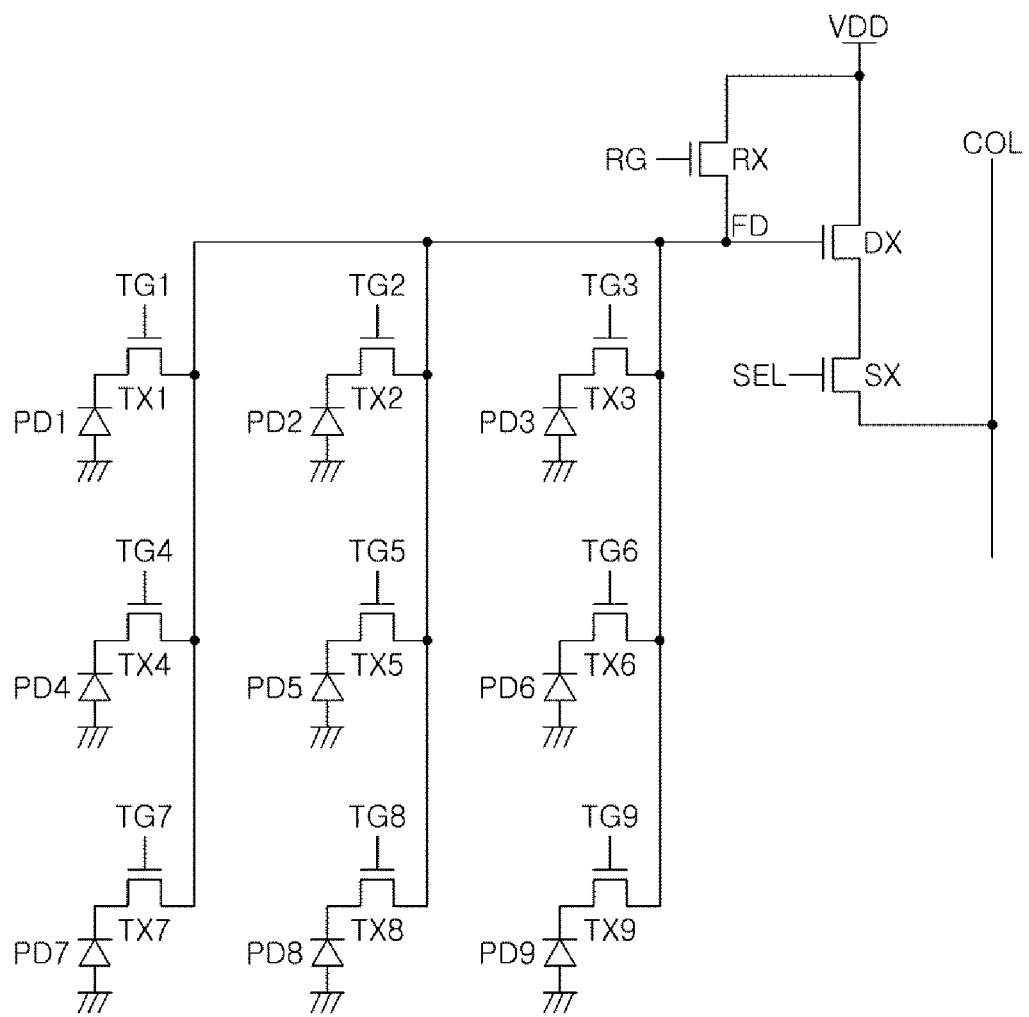
FIG. 4 is a diagram schematically illustrating a circuit of a pixel group included in an image sensor according to some example embodiments.

FIG. 4 is a diagram schematically illustrating a circuit of a pixel group included in an image sensor according to some example embodiments.

Referring to FIG. 4, the pixel group may include first to ninth photodiodes PD1-PD9 configured to generate electric charges in response to light. The pixel group may also include a pixel circuit. The pixel circuit may process charges generated by the first to ninth photodiodes PD1 to PD9 and output an electrical signal. The pixel circuit includes a floating diffusion region FD, a reset transistor RX, a driving transistor DX, a selection transistor SX, first to ninth transfer transistors TX1-TX9. Other components, such as a switching element SW, may be included in the pixel circuit. The pixel group is connected to a control logic of the image sensor through a column line COL, and the control logic may generate a pixel signal by obtaining a reset voltage and a pixel voltage through the column line COL.

Each of the first to ninth transfer transistors TX1 to TX9 may be connected to a corresponding photodiode among the first to ninth photodiodes PD1 to PD9, and the first to ninth unit pixels may share one floating diffusion region FD.

The reset transistor RX is connected between a power node supplying the power voltage VDD and the floating diffusion region FD, and may be controlled by the reset control signal RG. For example, when the reset transistor RX is turned on, the voltage of the floating diffusion region FD may be reset to a power supply voltage VDD. When the voltage of the floating diffusion region FD is reset, the selection transistor SX may be turned on by the selection control signal SEL to output the reset voltage to the column line COL.

In some example embodiments, each of the first to ninth photodiodes PD1 to PD9 may generate electrons as main charge carriers in response to light. When at least one of the first to ninth transfer transistors TX1 to TX9 is turned on after the reset voltage is output to the column line COL, the corresponding photodiode may be exposed to light and the generated charge may move to the floating diffusion region FD. When a plurality of transfer transistors among the first to ninth transfer transistors TX1 to TX9 are simultaneously turned on, charges generated from the plurality of photodiodes may move to the floating diffusion region FD. In this case, charges generated from each photodiode may be summed (or averaged) with each other in the floating diffusion region FD.

The driving transistor DX may operate as a source-follower amplifier configured to amplify the voltage of the floating diffusion region FD, and when the selection transistor SX is turned on by the selection control signal SEL, a pixel voltage corresponding to the charge generated by one photodiode PD, or a pixel voltage corresponding to the sum of charges generated by the plurality of photodiodes in the floating diffusion region FD, may be output to the column line COL.

Each of the reset voltage and the pixel voltage may be detected by a sampling circuit connected to the column line COL. The sampling circuit includes a plurality of samplers, and an analog-to-digital converter (ADC) may be connected to an output terminal of at least one of the samplers. The analog-to-digital converter may output reset data corresponding to the comparison result of the ramp voltage and the reset voltage, and may output pixel data corresponding to the comparison result of the ramp voltage and the pixel voltage. The control logic may generate image data using a pixel signal corresponding to a difference between the reset data and the pixel data.

According to some example embodiments, the control logic may group a plurality of unit pixels in one pixel group, classify the plurality of unit pixels into subgroups, and drive the unit pixels for each subgroup. For example, the on and off timing of the transfer transistors included in the unit pixels may be differently adjusted for each subgroup.

Hereinafter, some example embodiments according to the circuit illustrated in FIG. 4 will be described with reference to FIGS. 5 to 20.

First Embodiment

Figure 5:
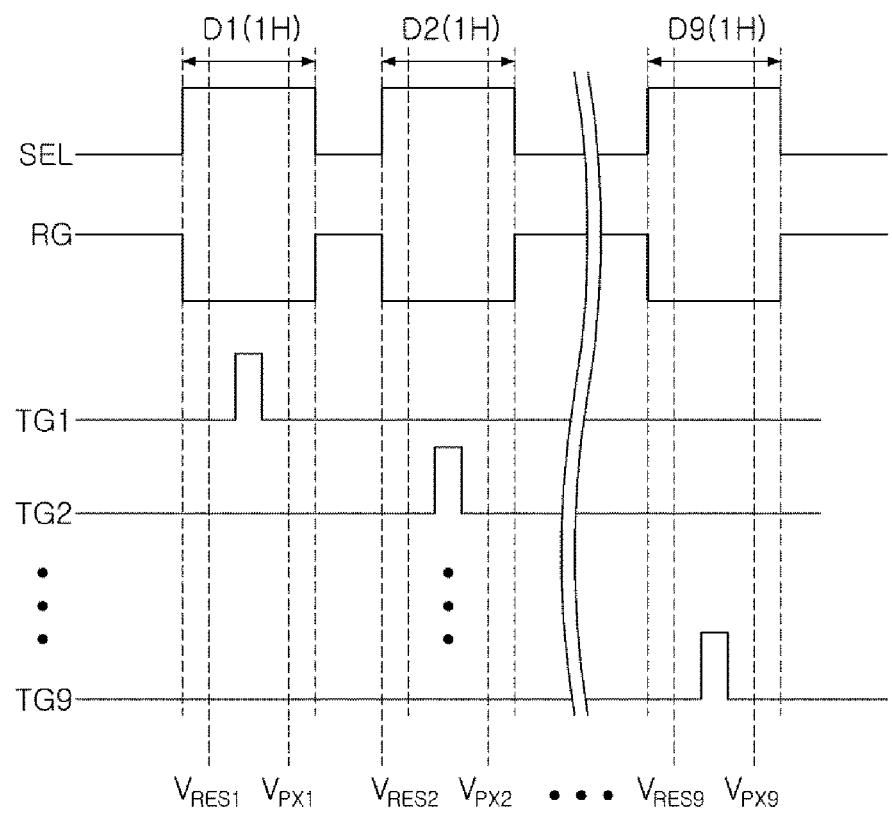
FIGS. 5 to 6D are diagrams illustrating a method of operating an image sensor in a full-mode according to some example embodiments.
Figure 6A:
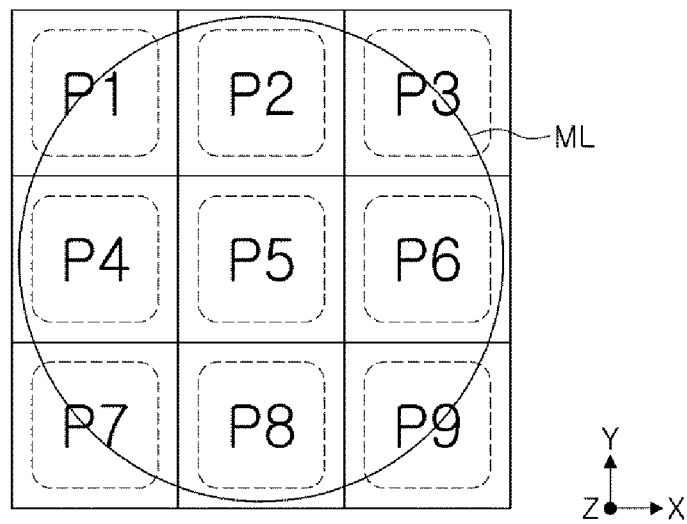
Figure 6B:
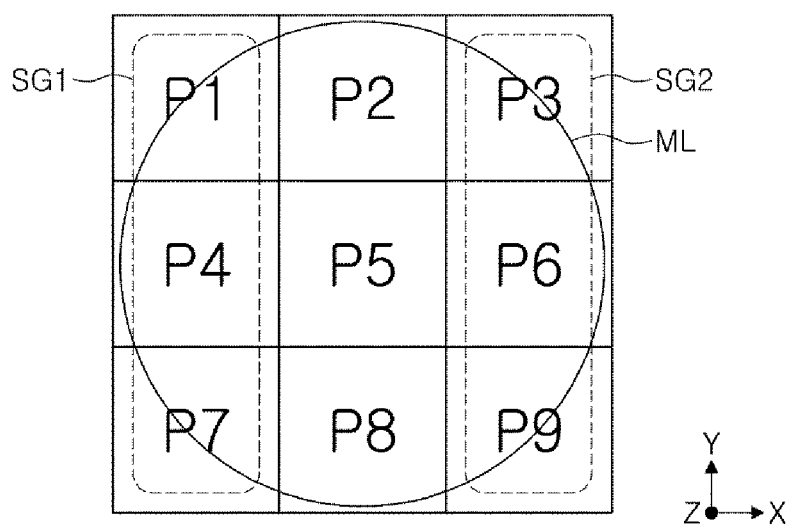
Figure 6C:
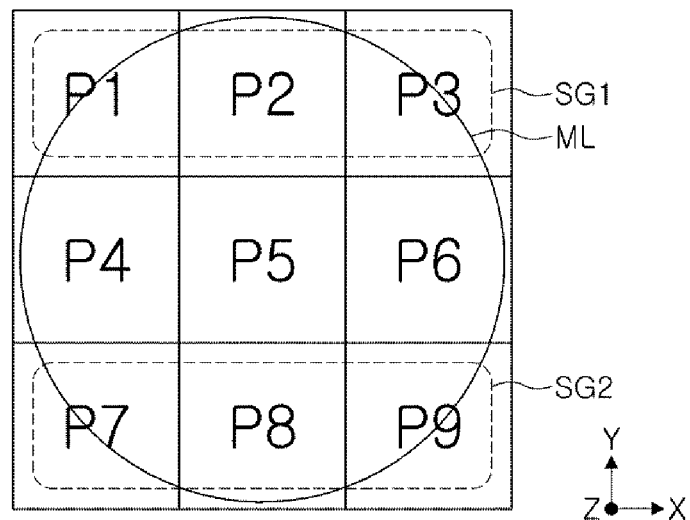
Figure 6D:
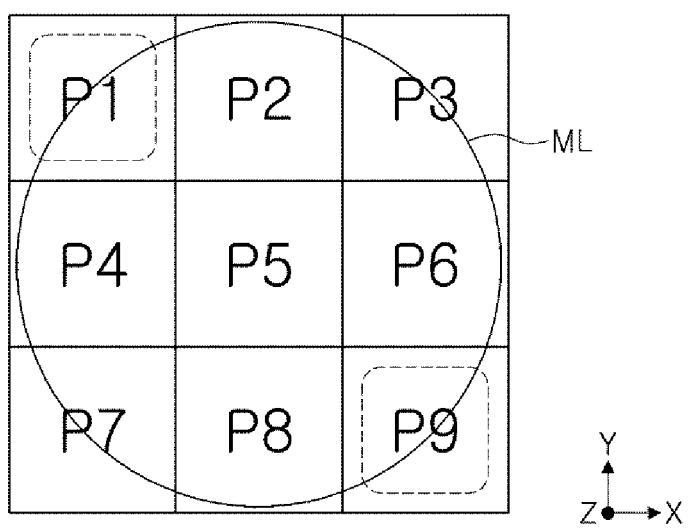

FIGS. 5 to 6D are diagrams illustrating a method of operating an image sensor in a full-mode according to some example embodiments. The full mode may refer to performing sampling and holding, and analog-to-digital converting operations, on voltages sensed by all unit pixels constituting the pixel array of the image sensor.

Referring to FIGS. 4 and 5, the reset transistor RX may be turned on by the reset control signal RG to reset the voltage of a floating diffusion region FD. When the voltage of the floating diffusion region FD is reset, the reset transistor RX may be turned off, the selection transistor SX may be turned on by the selection control signal SEL, and the correlated double sampler CDS of the readout circuit may read a first reset voltage $V_{RES1}$ from the first unit pixel. When the first reset voltage $V_{RES1}$ is read, the first transfer transistor TX1 is turned on by a first transfer control signal TG1 such that the charge of the first photodiode PD1 may be transferred to the floating diffusion region FD. The readout circuit may read a first pixel voltage $V_{PX1}$ from the first unit pixel. The readout circuit may read the first reset voltage $V_{RES1}$ and the first pixel voltage $V_{PX1}$ during a first horizontal period D1, and the readout circuit may obtain image data corresponding to the difference between the first reset voltage $V_{RES1}$ and the first pixel voltage $V_{PX1}$.

The selection transistor SX may be turned off and the reset transistor RX may be turned on to reset the voltage of the floating diffusion region FD. When the voltage of the floating diffusion region FD is reset, the reset transistor RX may be turned off, the select transistor SX may be turned on by the selection control signal SEL, and the correlated double sampler CDS of the readout circuit may read a second reset voltage $V_{RES2}$ from the second unit pixel. When the second reset voltage $V_{RES2}$ is read, a second transfer transistor TX2 may be turned on by a second transfer control signal TG2 such that the charge of a second photodiode PD2 may be transferred to the floating diffusion region FD. The readout circuit may read the second pixel voltage $V_{PX2}$ from the second unit pixel. The readout circuit may read the second reset voltage $V_{RES2}$ and the second pixel voltage $V_{PX2}$ during a second horizontal period D2, and the readout circuit may obtain image data corresponding to the difference between the second reset voltage $V_{RES2}$ and the second pixel voltage $V_{PX2}$.

In a similar manner, the image sensor may acquire first to ninth image data corresponding to the first to ninth unit pixels, respectively. The control logic may differently adjust the on and off timings of the first to ninth transfer transistors TX1 to TX9 in one pixel group, and image data corresponding to each of the plurality of unit pixels in the one pixel group may be obtained.

In the full-mode, the horizontal period may indicate a time required for the image sensor to drive one unit pixel and obtain a pixel signal from the one unit pixel. Accordingly, a total of 9 horizontal periods may be required in the full-mode.

Referring to FIG. 6A, the signal processing circuit may receive image data corresponding to each of the first to ninth unit pixels and generate an image from each of the image data. Accordingly, an image having a relatively high or higher resolution may be generated.

Referring to FIG. 6B, a first unit pixel P1, a fourth unit pixel P4, and a seventh unit pixel P7 may constitute a first subgroup SG1, and a third unit pixel P3, a sixth unit pixel P6, and a ninth unit pixel P9 may constitute a second subgroup SG2. The signal processing circuit may generate first image data by summing image data corresponding to the first unit pixel P1, the fourth unit pixel P4, and the seventh unit pixel P7 respectively, and may generate second image data by summing image data corresponding to the third unit pixel P3, the sixth unit pixel P6, and the ninth unit pixel P9 respectively. The signal processing circuit may calculate a first disparity by using the first image data corresponding to the first subgroup SG1 and the second image data corresponding to the second subgroup SG2. The signal processing circuit may detect a phase difference in a first direction (e.g., a horizontal direction) using the calculated first disparity, and may obtain autofocusing and distance data from the phase difference.

Referring to FIG. 6C, the first unit pixel P1, the second unit pixel P2, and the third unit pixel P3 may constitute the first subgroup SG1, and the seventh unit pixel P7, the eighth unit pixel P8, and the ninth unit pixel P9 may constitute the second subgroup SG2. The signal processing circuit may generate first image data by summing image data corresponding to the first unit pixel P1, the second unit pixel P2, and the third unit pixel P3 respectively, and may generate second image data by summing image data corresponding to the seventh unit pixel P7, the eighth unit pixel P8 and the ninth unit pixel P9 respectively. The signal processing circuit may calculate a second disparity by using the first image data corresponding to the first subgroup SG1 and the second image data corresponding to the second subgroup SG2. The signal processing circuit may detect a phase difference in a second direction (e.g., a vertical direction) using the calculated second disparity, and may obtain autofocusing and distance data from the phase difference.

Referring to FIG. 6D, the signal processing circuit may calculate a third disparity by using first image data corresponding to the first unit pixel P1 and second image data corresponding to the ninth unit pixel P9. The signal processing circuit may detect a phase difference in a first direction and a second direction, e.g., vertical and horizontal directions, using the calculated third disparity, and may obtain autofocusing and distance data from the phase difference.

According to some example embodiments, pixels for providing distance data and autofocusing may be spaced apart from each other horizontally and/or vertically. Since a distance between pixels for providing distance data and autofocusing may be secured, phase separation by light may be assured, and thus more accurate autofocusing and distance data may be obtained.

Second Embodiment

Figure 7:
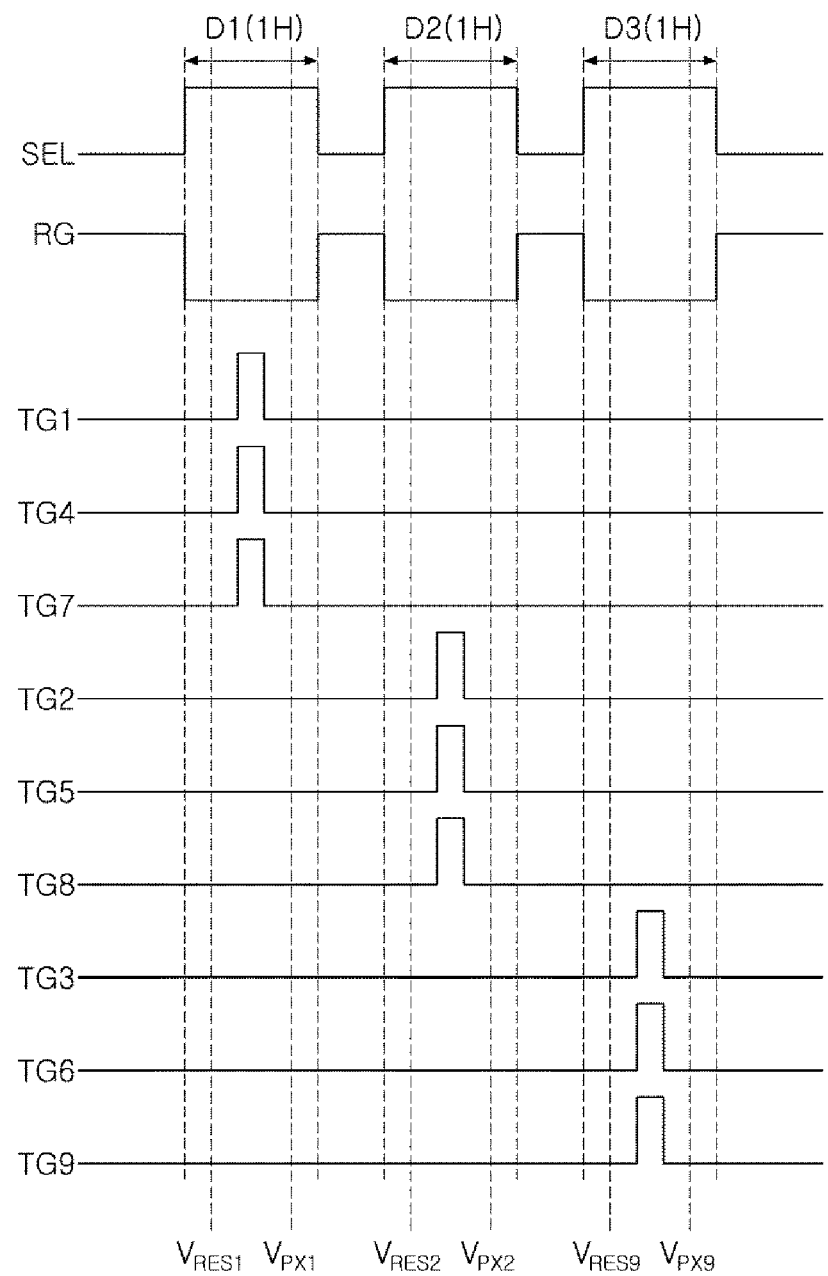
FIGS. 7 to 8B are diagrams illustrating a method of operating an image sensor in a binning mode according to some example embodiments.
Figure 8A:
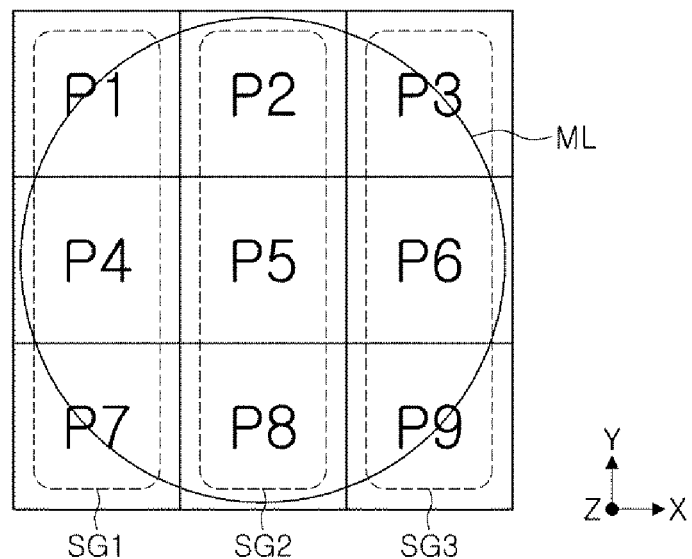
Figure 8B:
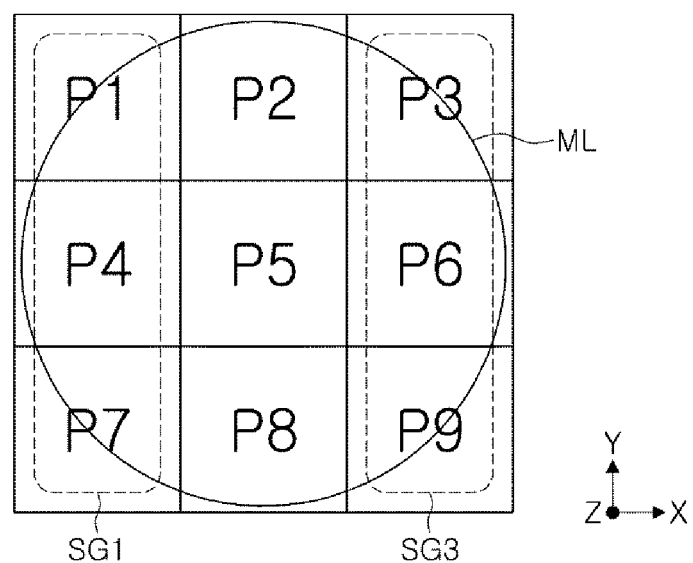

FIGS. 7 to 8B are diagrams illustrating a method of operating an image sensor in a binning mode according to some example embodiments. Unlike the full-mode described with respect to FIGS. 5 to 6D, the binning mode may refer to a mode in which a value obtained by adding up (or averaging) output values of pixels of the same type is output as a sensing voltage. In the presently described example, a binning mode for outputting a sum (or an average value) of outputs of three unit pixels as a sensing voltage will be described.

Referring to FIG. 7, the reset transistor RX may be turned on by a reset control signal RG to reset the voltage of the floating diffusion region FD. When the voltage of the floating diffusion region FD is reset, the reset transistor RX may be turned off, the selection transistor may be is turned on by a selection control signal SEL, and the correlated double sampler CDS of the readout circuit may read the first reset voltage $V_{RES1}$ from the first unit pixel.

In contrast to FIG. 5, the first transfer transistor TX1, the fourth transfer transistor TX4, and the seventh transfer transistor TX7 may be simultaneously turned on during a first horizontal period D1. In this case, the charge generated by the first photodiode PD1, the charge generated by the fourth photodiode PD4, and the charge generated by the seventh photodiode PD7 may be added together in the floating diffusion region FD. The readout circuit may read the first pixel voltage $V_{PX1}$ corresponding to an amount of charges accumulated in the floating diffusion region FD. The readout circuit may read the first reset voltage $V_{RES1}$ and the first pixel voltage $V_{PX1}$ during the first horizontal period D1, and may obtain first image data corresponding to the difference between the first reset voltage $V_{RES1}$ and the first unit pixel voltage $V_{PX1}$.

During a second horizontal period D2, a second transfer transistor TX2, a fifth transfer transistor TX5, and an eighth transfer transistor TX8 may be simultaneously turned on. In this case, the charge generated by the second photodiode PD2, the charge generated by the fifth photodiode PD5, and the charge generated by the eighth photodiode PD8 may be added together in the floating diffusion region FD. The readout circuit may read the second pixel voltage $V_{PX2}$ corresponding to an amount of charges accumulated in the floating diffusion region FD. The readout circuit may read the second reset voltage $V_{RES2}$ and the second pixel voltage $V_{PX2}$ during the second horizontal period D2, and may obtain second image data corresponding to the difference between the second reset voltage $V_{RES2}$ and the second pixel voltage $V_{PX2}$.

During a third horizontal period D3, a third transfer transistor TX3, a sixth transfer transistor TX6, and the ninth transfer transistor TX9 may be simultaneously turned on. In this case, the charge generated by the third photodiode PD3, the charge generated by the sixth photodiode PD6, and the charge generated by the ninth photodiode PD9 may be added together in the floating diffusion region FD. The readout circuit may read the third pixel voltage $V_{PX3}$ corresponding to an amount of charges accumulated in the floating diffusion region FD. The readout circuit may read the third reset voltage $V_{RES3}$ and the third unit pixel voltage $V_{PX3}$ during the third horizontal period D3, and may obtain third image data corresponding to the difference between the third reset voltage $V_{RES3}$ and the third pixel voltage $V_{PX3}$.

In the binning mode, the horizontal period may refer to a time required for the image sensor to simultaneously drive a plurality of unit pixels and obtain a pixel signal from the plurality of unit pixels. Therefore, unlike the full-mode, since a total of three horizontal periods are required in the binning mode, a high-speed or higher-speed operation may be possible as compared to the full-mode.

Referring to FIG. 8A, the first unit pixel P1, the fourth unit pixel P4, and the seventh unit pixel P7 may constitute a first subgroup SG1, and the second unit pixel P2, the fifth unit pixel P5 and the eighth unit pixel P8 may constitute a second subgroup SG2, and the third unit pixel P3, the sixth unit pixel P6 and the ninth unit pixel P9 may constitute a third subgroup SG3.

As described with reference to FIG. 7, the control logic may simultaneously turn the transfer transistors TX1, TX4, and TX7 of the first subgroup SG1 on and off, and may simultaneously turn the transfer transistors TX2, TX5 and TX8 of the second subgroup SG2 on and off at a time different from that of the transfer transistors TX1, TX4 and TX7 of the first subgroup SG1. In addition, the control logic may simultaneously turn the transfer transistors TX3, TX6 and TX9 of the third subgroup SG3 on and off at a time different from that of the transfer transistors TX1, TX4 and TX7 of the first subgroup SG1 and the transfer transistors TX2, TX5 and TX8 of the second subgroup SG2.

The signal processing circuit may generate the image by summing the first image data corresponding to the first subgroup SG1, the second image data corresponding to the second subgroup SG2, and the third image data corresponding to the third subgroup SG3. Accordingly, an image with high or higher sensitivity may be generated.

Referring to FIG. 8B, the signal processing circuit may calculate a disparity by using the first image data corresponding to the first subgroup SG1 and the third image data corresponding to the third subgroup SG3. The signal processing circuit may detect a phase difference in a first direction (e.g., a horizontal direction) using the calculated disparity, and obtain autofocusing and distance data from the phase difference.

The second subgroup SG2 may be between the first subgroup SG1 and the third subgroup SG3. Accordingly, pixels for providing distance data and autofocusing (e.g., pixels of the first subgroup SG1 and pixels of the third subgroup SG3) may be spaced apart from each other. Since a distance between pixels for providing distance data and autofocusing may be secured, phase separation by light may be assured, and thus more accurate autofocusing and distance data may be obtained.

In the above, only some example embodiments in which the phase difference in the horizontal direction is detected in the binning mode and autofocusing and distance data is obtained is illustrated and described. However, an image sensor according to some example embodiments of the present inventive concepts may detect the phase difference in the vertical and/or horizontal directions in the binning mode, and may obtain autofocusing and distance data.

Third Embodiment

Figure 9:
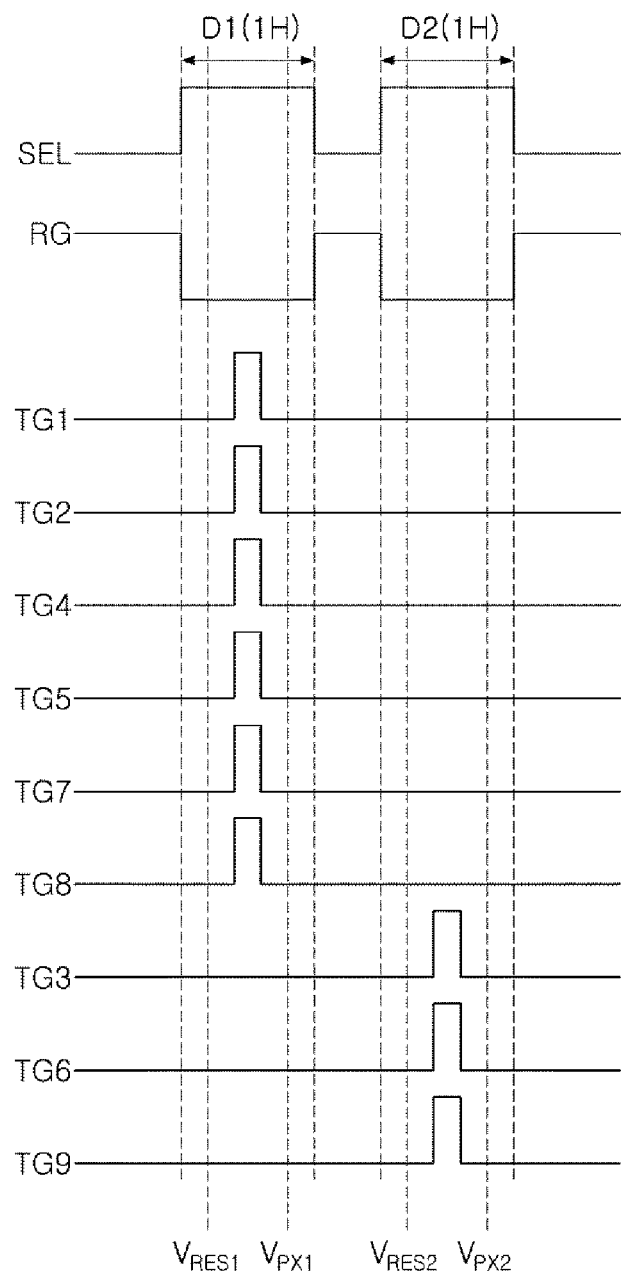
FIGS. 9 and 10 are diagrams illustrating a method of operating an image sensor in a binning mode according to some example embodiments.
Figure 10:
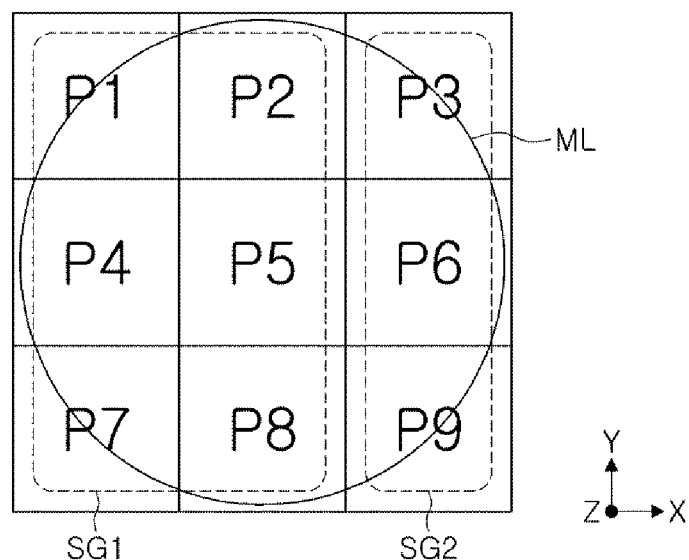

FIGS. 9 and 10 are diagrams illustrating a method of operating an image sensor in a binning mode according to some example embodiments of the present inventive concepts.

Unlike the embodiment described with reference to FIGS. 7 to 8B, in the embodiment described with reference to FIGS. 9 and 10 a binning mode in which a value (or an average value) obtained by summing the outputs of six unit pixels is output as a sensing voltage and in which a value (or an average value) obtained by summing the outputs of the remaining three unit pixels is output as a sensing voltage, will be described.

Referring to FIG. 9, the reset transistor RX may be turned on by the reset control signal RG to reset the voltage of the floating diffusion region FD. When the voltage of the floating diffusion region FD is reset, the reset transistor RX may be turned off, the selection transistor SX may be turned on by the selection control signal SEL, and the correlated double sampler CDS of the readout circuit may read the first reset voltage $V_{RES1}$ from the first unit pixel.

In contrast to FIG. 7, in FIG. 9 during the first horizontal period D1, the first transfer transistor TX1, the second transfer transistor TX2, the fourth transfer transistor TX4, the fifth transfer transistor TX5, the seventh transfer transistor TX7, and the eighth transfer transistor TX8 may be turned on simultaneously with each other. In this case, the charge generated by the first photodiode PD1, the charge generated by the second photodiode PD2, the charge generated by the fourth photodiode PD4, the charge generated by the fifth photodiode PD5, the charge generated by the seventh photodiode PD7, and the charge generated by the eighth photodiode PD8 may be added together in the floating diffusion region FD. The readout circuit may read the first pixel voltage $V_{PX1}$ corresponding to an amount of charges accumulated in the floating diffusion region FD. The readout circuit may read the first reset voltage $V_{RES1}$ and the first pixel voltage $V_{PX1}$ during the first horizontal period D1 and may obtain first image data corresponding to a difference between the first reset voltage $V_{RES1}$ and the first pixel voltage $V_{PX1}$.

During the second horizontal period D2, the third transfer transistor TX3, the sixth transfer transistor TX6, and the ninth transfer transistor TX9 may be simultaneously turned on. In this case, the charge generated by the third photodiode PD3, the charge generated by the sixth photodiode PD6, and the charge generated by the ninth photodiode PD9 may be added together in the floating diffusion region FD. The readout circuit may read the second pixel voltage $V_{PX2}$ corresponding to an amount of charges accumulated in the floating diffusion region FD. The readout circuit may read the second reset voltage $V_{RES2}$ and the second pixel voltage $V_{PX2}$ during the second horizontal period D2 and may obtain second image data corresponding to a difference between the second reset voltage $V_{RES2}$ and the second pixel voltage $V_{PX2}$.

Referring to FIG. 10, the first unit pixel P1, the second unit pixel P2, the fourth unit pixel P4, the fifth unit pixel P5, the seventh unit pixel P7, and the eighth unit pixel P8 may constitute a first subgroup SG1, and the third unit pixel P3, the sixth unit pixel P6, and the ninth unit pixel P9 may constitute a second subgroup SG2.

As described with reference to FIG. 9, the control logic may simultaneously turn on and off the transfer transistors TX1, TX2, TX4, TX5, TX7, and TX8 of the first subgroup SG1, and may simultaneously turn the transfer transistors TX3, TX6, and TX9 of the second subgroup SG2 on and off at a time different from the transfer transistors TX1, TX2, TX4, TX5, TX7, and TX8 of the first subgroup SG1.

The signal processing circuit may sum the first image data corresponding to the first subgroup SG1 and the second image data corresponding to the second subgroup SG2, thereby generating an image. Accordingly, an image with high or higher sensitivity may be generated.

Also, the signal processing circuit may calculate a disparity by using the first image data corresponding to the first subgroup SG1 and the second image data corresponding to the second subgroup SG2. The signal processing circuit may detect a phase difference in a first direction (e.g., a horizontal direction) using the calculated disparity, and may obtain autofocusing and distance data from the phase difference.

According to some example embodiments, the number of unit pixels included in the first subgroup SG1 may be different from the number of unit pixels included in the second subgroup SG2. For example, the number of unit pixels included in the first subgroup SG1 and the number of unit pixels included in the second subgroup SG2 may have a 1:2 ratio. Therefore, the distance between pixels for providing distance data and autofocusing may be relatively reduced. Although the phase separation characteristic by light may be relatively unfavorable, since the readout circuit may only need to read the pixel signal from the pixel array twice, read noise characteristics may be advantageous.

As described, FIGS. 5 to 10 illustrate example embodiments in which an image is generated using a pixel signal generated during one frame period and distance data and autofocusing are provided. Hereinafter, some example embodiments in which an image is generated using a pixel signal generated during a first frame period and distance data and autofocusing are provided using a pixel signal generated during a second frame period will be described with reference to FIGS. 11 to 15.

Fourth Embodiment

Figure 11:
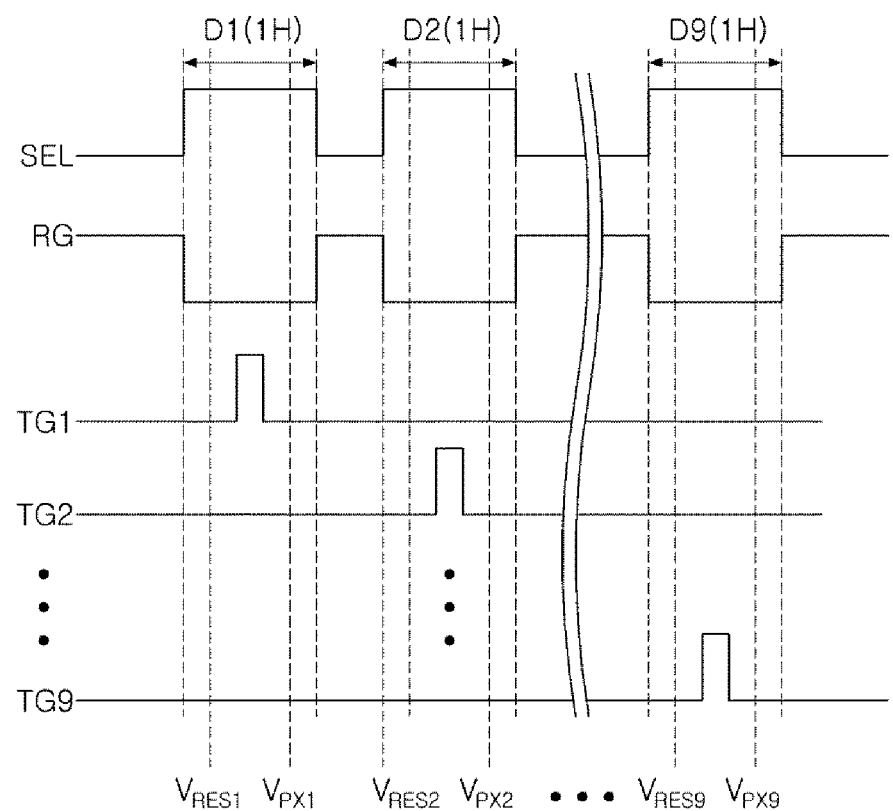
FIGS. 11 and 12 are diagrams illustrating a method of operating an image sensor in a first frame period according to some example embodiments.
Figure 12:
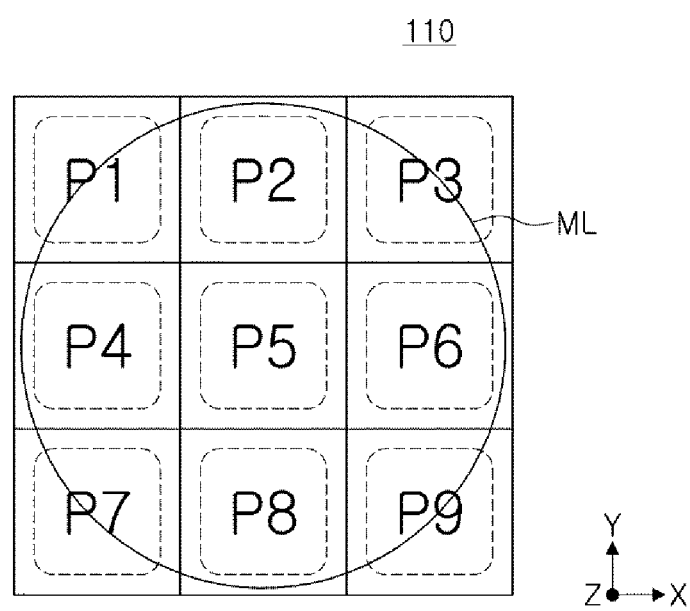

FIGS. 11 and 12 are diagrams illustrating a method of operating an image sensor in a first frame period according to some example embodiments, and FIGS. 13A to 15B are drawings illustrating a method of obtaining autofocusing and distance data by the image sensor in a second frame period.

Since the structure and operation method of FIGS. 11 and 12 are similar to the structure and operation method of FIGS. 5 and 6A, respectively, overlapping description thereof will be omitted here. Referring to FIGS. 11 and 12, the image sensor may operate in a first operation mode (e.g., a full mode) during the first frame period. The control logic may differently adjust on and off timings of the first to ninth transfer transistors in one pixel group 110.

When the control logic obtains first to ninth image data respectively corresponding to the first to ninth unit pixels P1-P9 of one pixel group 110 in the first operation mode, the signal processing circuit may generate an image from each of the image data.

Figure 13A:
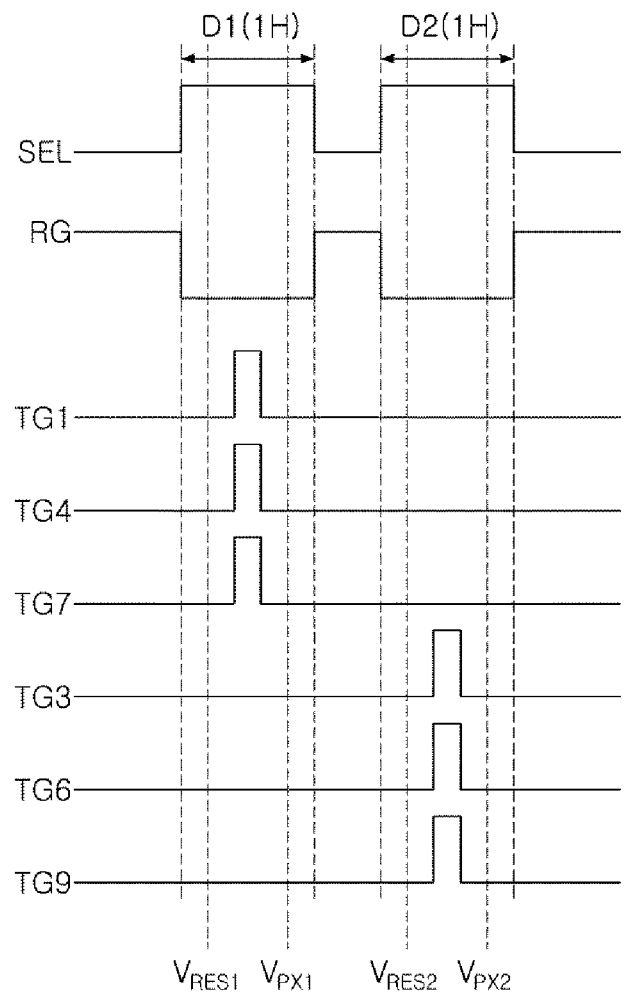
FIGS. 13A to 15B are diagrams illustrating a method in which an image sensor acquires autofocusing and distance data in a second frame period.
Figure 13B:
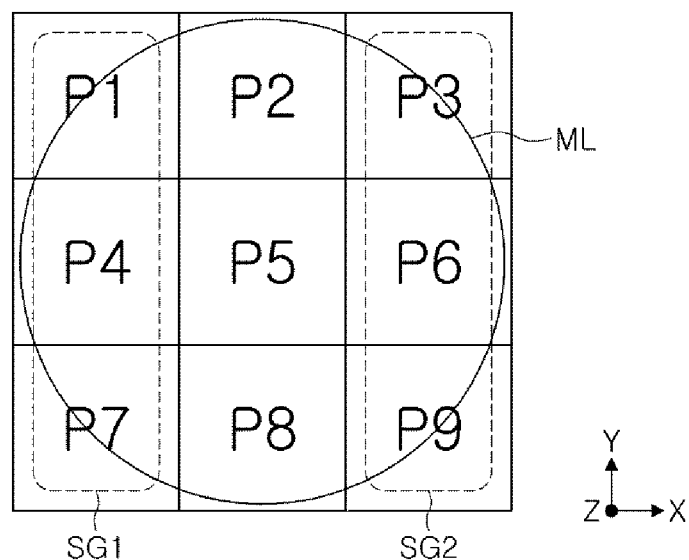

Referring to FIGS. 13A and 13B, a first unit pixel P1, a fourth unit pixel P4, and a seventh unit pixel P7 may constitute a first subgroup SG1, and a third unit P3, a sixth unit pixel P6, and a ninth unit pixel P9 may constitute a second subgroup SG2.

During the second frame period after the first frame period, the image sensor may operate in a second operation mode (e.g., a binning mode). In the second operation mode, the control logic may simultaneously turn on and off the transfer transistors TX1, TX4, and TX7 of the first subgroup SG1, and may simultaneously turn on and off the transfer transistors TX3, TX6, and TX9 of the second subgroup SG2 at a different time from the transfer transistors TX1, TX4, and TX7 of the first subgroup SG1.

In the second operation mode, the control logic may read the first pixel voltage $V_{PX1}$ that corresponds to an amount resulting from summing charges generated by the photodiodes of the unit pixels P1, P4, and P7 included in the first sub-group SG1 during the first horizontal period D1 in the floating diffusion region FD. The control logic may read the second pixel voltage $V_{PX2}$ that corresponds to an amount resulting from summing charges generated by the photodiodes of the unit pixels P3, P6, and P9 included in the second subgroup SG2 during the second horizontal period D2 in the floating diffusion region FD. The control logic may generate first image data from the first pixel voltage $V_{PX1}$ and generate second image data from the second pixel voltage $V_{PX2}$.

The signal processing circuit may calculate a disparity by using the first image data corresponding to the first subgroup SG1 and the second image data corresponding to the second subgroup SG2. The signal processing circuit may detect a phase difference in a first direction (e.g., a horizontal direction) using the calculated disparity, and may obtain autofocusing and distance data from the phase difference.

Figure 14A:
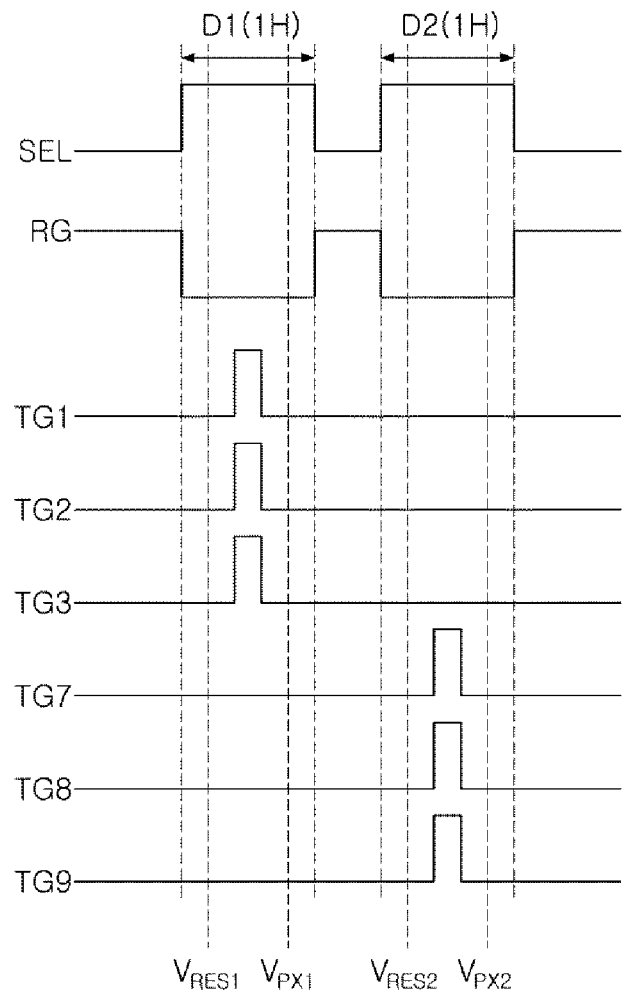
Figure 14B:
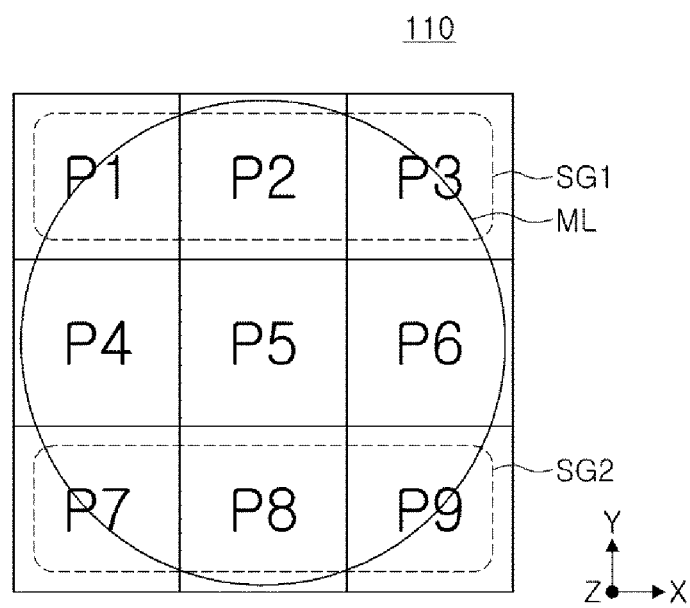

Referring to FIGS. 14A and 14B, unlike FIGS. 13A and 13B, a phase difference in a second direction (e.g., a vertical direction) may be detected, and autofocusing and distance data may be obtained from the phase difference. The first unit pixel P1, the second unit pixel P2, and the third unit pixel P3 may constitute the first subgroup SG1, and the seventh unit pixel P7, the eighth unit pixel P8 and the ninth unit pixel P9 may constitute the second subgroup SG2.

During the second frame period after the first frame period, the image sensor may operate in the second operation mode (e.g., a binning mode). In the second operation mode, the control logic may simultaneously turn on and off the transfer transistors TX1, TX2, and TX3 of the first subgroup SG1, and may simultaneously turn on and off the transfer transistors TX7, TX8 and TX9 of the second subgroup SG2 at a different time from the transfer transistors TX1, TX2, and TX3 of the first subgroup SG1.

In the second operation mode, the control logic may read the first pixel voltage $V_{PX1}$ corresponding to an amount of charges resulting from summing the charges generated by the photodiodes of the unit pixels P1, P2, and P3 included in the first subgroup SG1 during the first horizontal period D1 in the floating diffusion region FD. The control logic may read the second pixel voltage $V_{PX2}$ corresponding to an amount of charges resulting from summing the charges generated by the photodiodes of the unit pixels P7, P8, and P9 included in the second subgroup SG2 during the second horizontal period D2 in the floating diffusion region FD. The control logic may generate first image data from the first pixel voltage $V_{PX1}$ and may generate second image data from the second pixel voltage $V_{PX2}$.

The signal processing circuit may calculate a disparity by using the first image data corresponding to the first subgroup SG1 and the second image data corresponding to the second subgroup SG2. The signal processing circuit may detect a phase difference in the second direction (e.g., a vertical direction) using the calculated disparity, and may obtain autofocusing and distance data from the phase difference.

Figure 15A:
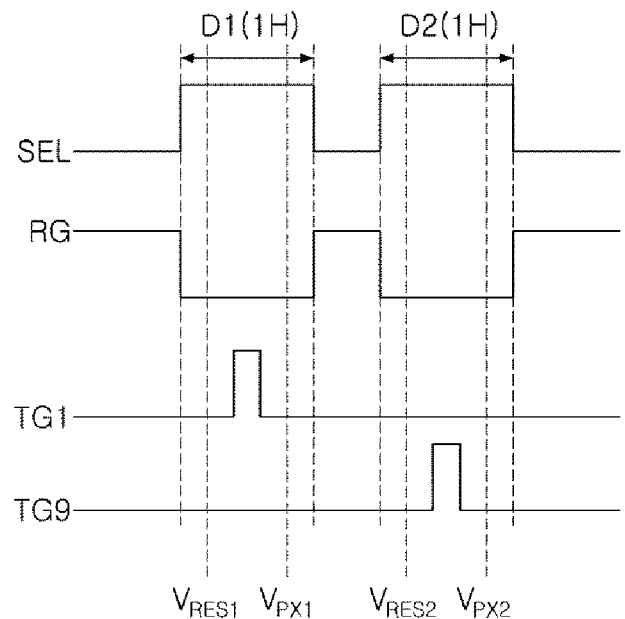
Figure 15B:
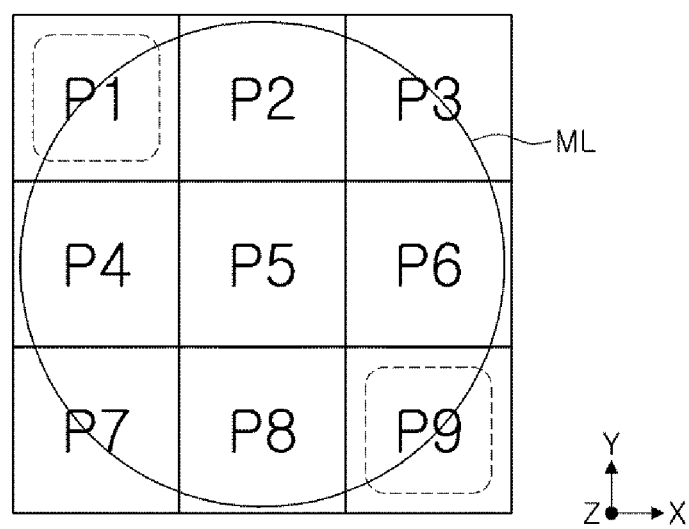

Referring to FIGS. 15A and 15B, unlike FIGS. 13A and 13B, the phase difference in the first direction and the second direction (e.g., vertical and horizontal directions) may be detected, and autofocusing and distance data may be obtained from the phase difference.

During the second frame period after the first frame period, the control logic may read the first pixel voltage $V_{PX1}$ corresponding to the charge generated by the photodiode of the first unit pixel P1 during the first horizontal period D1. The control logic may read the second pixel voltage $V_{PX2}$ corresponding to the amount of charge generated by the photodiode of the ninth unit pixel P9 during the second horizontal period D2. The control logic may generate first image data from the first pixel voltage $V_{PX1}$ and generate second image data from the second pixel voltage $V_{PX2}$.

The signal processing circuit may calculate a disparity by using the first image data and the second image data. The signal processing circuit may detect a phase difference in the first direction and the second direction (e.g., vertical and horizontal directions) using the calculated disparity, and obtain autofocusing and distance data from the phase difference.

Figure 16:
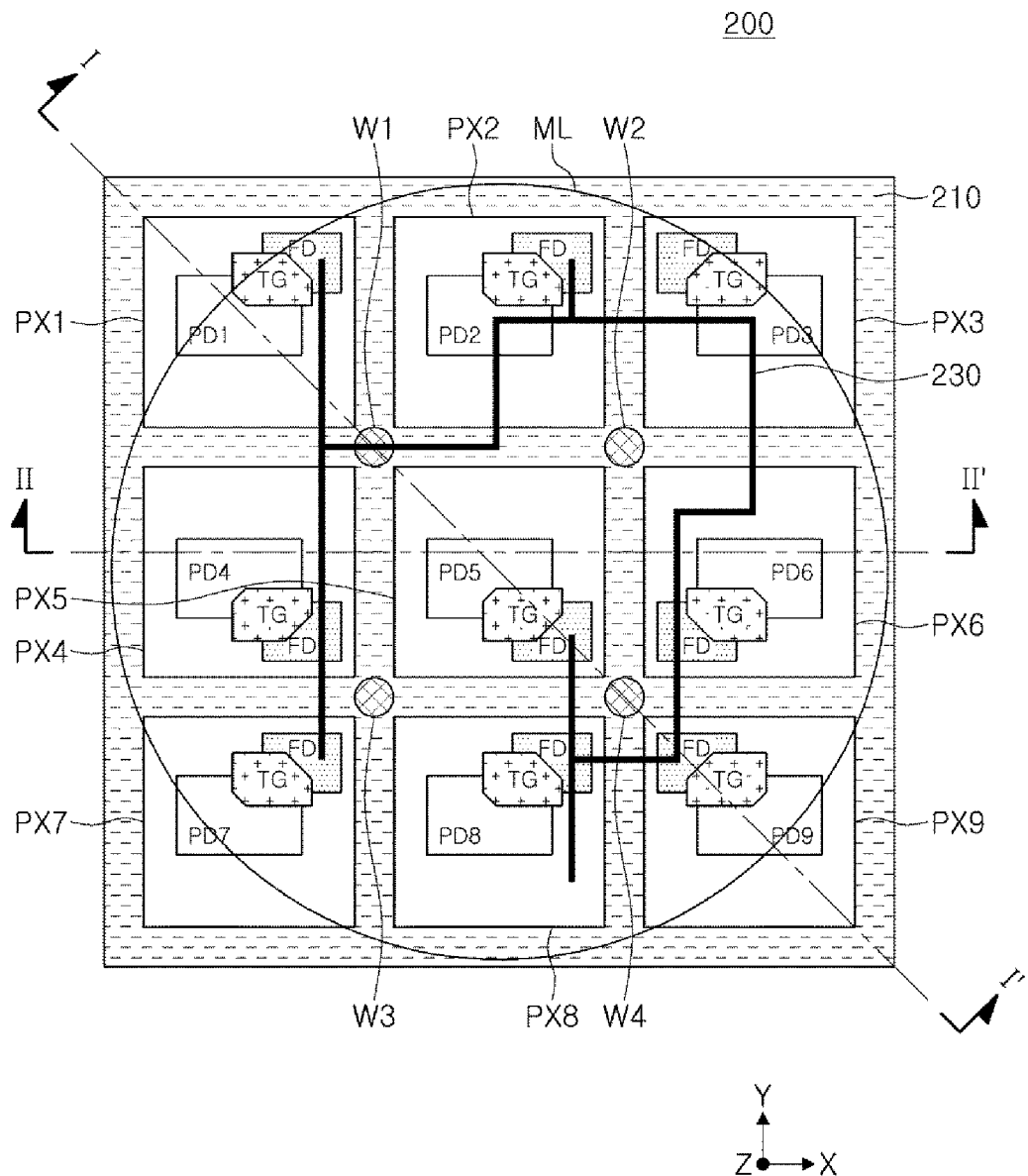
FIG. 16 is a plan view schematically illustrating a pixel included in an image sensor according to some example embodiments.

FIG. 16 is a plan view schematically illustrating a pixel included in an image sensor according to some example embodiments.

Referring to FIG. 16, in a pixel array 200 according to some example embodiments, first to ninth unit pixels PX1 to PX9 may constitute one pixel group. The first to ninth unit pixels PX1 to PX9 may be arranged on a substrate. Although not shown, a plurality of pixel groups may be arranged in a first direction (e.g., an X-axis direction) and a second direction (e.g., a Y-axis direction) parallel to the upper surface of the substrate. A device isolation layer 210 may extend in a third direction (e.g., a Z-axis direction) perpendicular to the upper surface of the substrate. The device isolation layer 210 may provide a first potential barrier between adjacent pixel groups. For example, the device isolation layer 210 may be formed by forming a trench extending in the third direction (e.g., the Z-axis direction) perpendicular to the upper surface of the substrate and at least partially filling the trench with a material such as polysilicon. For example, the device isolation layer 210 may be a front deep trench isolation (FDTI) that is vertically extended (or formed) from a first surface (e.g., an upper region) of a semiconductor substrate, and the FDTI may indicate a DTI formed in a process of manufacturing a frontside-illuminated (FSI) image sensor. In some embodiments, the device isolation layer 210 may be a back deep trench isolation (BDTI) vertically extended (or formed) from a second surface (e.g., a lower region) of the semiconductor substrate, and the BDTI may indicate a DTI formed in a process of manufacturing a BSI (backside-illuminated) image sensor.

The first to ninth pixels PX1 to PX9 may include an active region formed by doping a semiconductor substrate with impurities, photodiodes PD1 to PD9, and a plurality of gates. The plurality of gates may be coupled to an active region to provide a plurality of transistors included in the pixel circuit. FIG. 16 illustrates only the transfer gate TG among the plurality of transistors in each of the first to ninth pixels PX1 to PX9, but each of the first to ninth pixels PX1 to PX9 may include at least one of a driving gate, a selection gate, and/or a dummy gate.

The floating diffusion regions FD in the first to ninth pixels PX1 to PX9, respectively, may be electrically connected to each other by at least one of wiring patterns 230, and the location and area of the floating diffusion region FD may be variously modified in different example embodiments.

In some example embodiments, COBs W1-W4 may be formed between the first to ninth unit pixels PX1-PX9. Charges may move between the photodiodes PD1-PD9 of one pixel group through the COBs W1-W4. In some embodiments in which the device isolation layer 210 is an FDTI, when the device isolation layer 210 is formed, the FDTI may not be formed in COB regions W1-W4. Thereafter, when the photodiodes PD1-PD9 are formed through the ion implantation process, the COBs W1-W4 may be formed together in the COB regions W1-W4, and the COBs W1-W4 may have a PN junction structure.

In some embodiments in which the device isolation layer 210 is BDTI, when the device isolation layer 210 is formed, in the third direction (e.g., the Z-axis direction) perpendicular to the upper surface of the substrate, the device isolation layers having different lengths may be formed in the COB regions W1-W4 and regions other than the COB regions W1-W4. A first length of the device isolation layer formed in the COB region W1-W4 in the third direction (e.g., the Z-axis direction) may be less than a second length of the device isolation layer formed in the region other than the COB region W1-W4. Thereafter, when the photodiodes PD1-PD9 are formed through the ion implantation process, the COBs W1-W4 may be formed together in the COB regions W1-W4.

In some embodiments, an FDTI having a second length may be formed in a region other than the COB regions W1-W4, and a BDTI having a first length shorter than the second length may be formed in the COB regions W1-W4. Thereafter, when the photodiodes PD1-PD9 are formed through the ion implantation process, the COBs W1-W4 may be formed together in the COB regions W1-W4.

The COBs W1-W4 may provide a second potential barrier between adjacent unit pixels PX. The second potential barrier provided by the COBs W1-W4 may be lower than the first potential barrier provided by the device isolation layer 210. Accordingly, charges may move between the photodiodes PD1-PD9 of one pixel group through the COBs W1-W4.

Figure 17A:
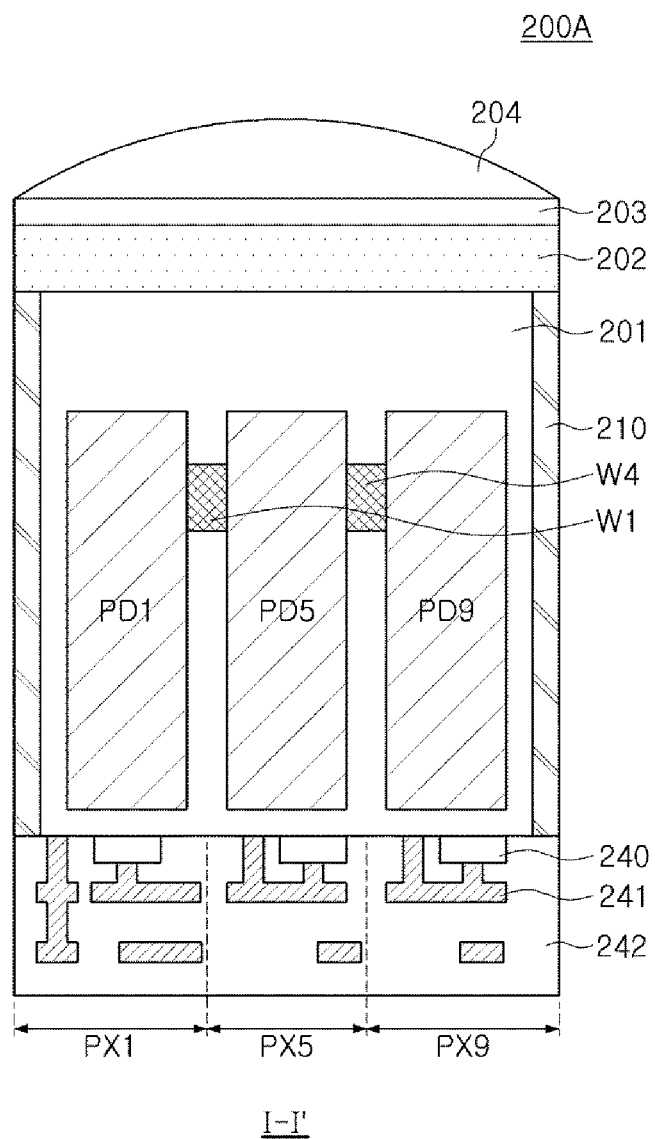
FIGS. 17A and 17B are cross-sectional views illustrating a cross-section of the image sensor illustrated in FIG. 16 taken in the I-I' direction according to some example embodiments.
Figure 17B:
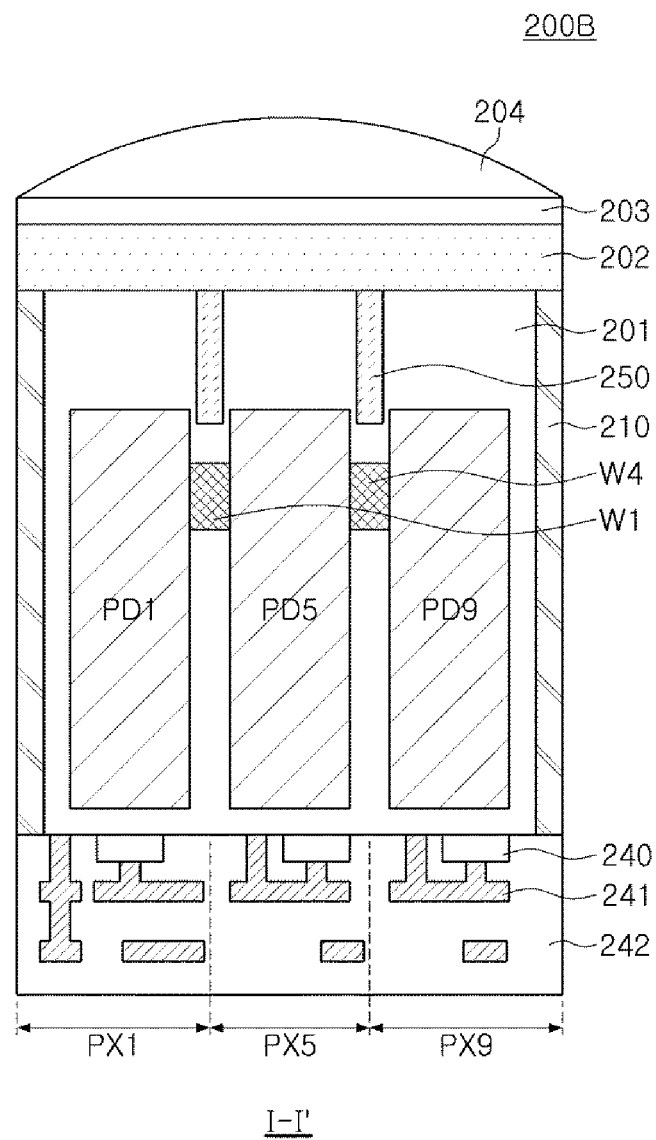
Figure 17C:
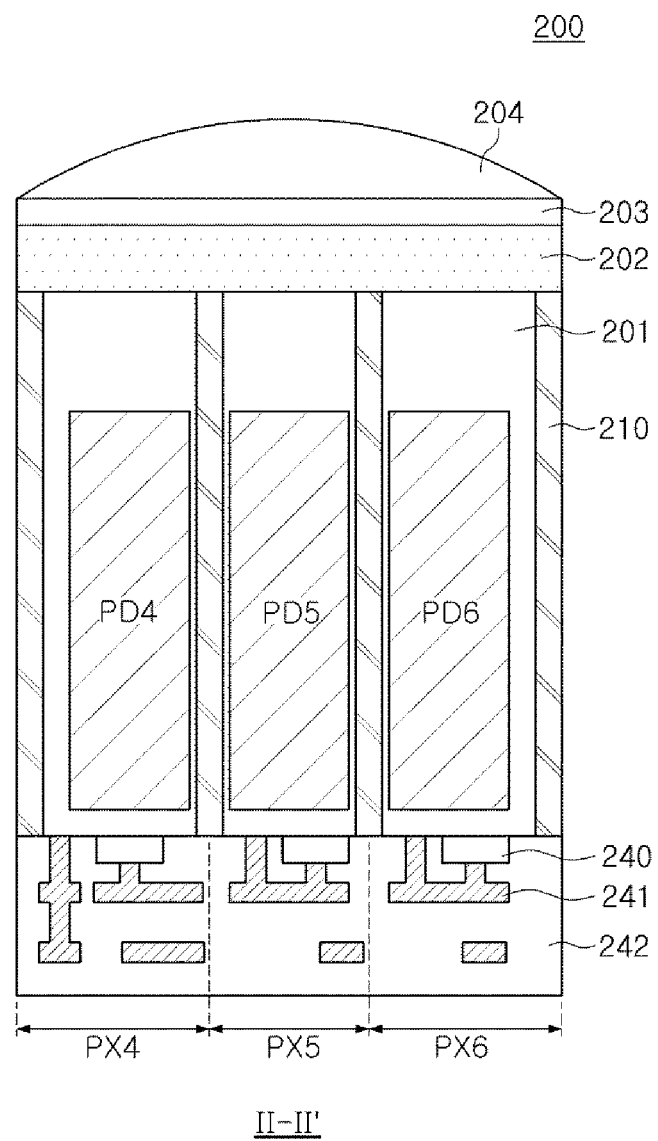
FIG. 17C is a cross-sectional view illustrating a cross-section of the image sensor illustrated in FIG. 16 taken in the II-II' direction according to some example embodiments.

FIGS. 17A and 17B are cross-sectional views illustrating a cross section of the image sensor illustrated in FIG. 16 taken in an I-I' direction according to some example embodiments, and FIG. 17C is a cross-sectional view illustrating a cross-section of the image sensor illustrated in FIG. 16 taken in a II-II' direction according to some example embodiments.

Referring to FIG. 17A, the device isolation layer 210 may be between pixel groups, and COBs W1 and W4 may be formed between the photodiodes PD1, PD5, and PD9. For example, the device isolation layer 210 may be FDTI, and the COBs W1 and W4 may have a PN junction structure.

A pixel circuit may be below the photodiodes PD1, PD5, and PD9. For example, the pixel circuit may include a plurality of devices 240, wiring patterns 241 connected to the plurality of devices 240, an insulating layer 242 covering the plurality of devices 240 and the wiring patterns 241, and other components, and may be on the first surface of the substrate 201.

The pixel circuit may include a floating diffusion region. A first floating diffusion region may be below the first photodiode, a fifth floating diffusion region may be below the fifth photodiode, and a ninth floating diffusion region may be below the ninth photodiode. The first floating diffusion region, the fifth floating diffusion region, and the ninth floating diffusion region may be electrically connected to each other by at least one of the wiring patterns 241. A first transfer transistor may be adjacent to the first floating diffusion region, a fifth transfer transistor may be adjacent to the fifth floating diffusion region, and a ninth transfer transistor may be adjacent to the ninth floating diffusion region. The gate of each of the first transfer transistor, the fifth transfer transistor, and the ninth transfer transistor may have a vertical structure in which at least partial regions thereof are buried in the substrate 201.

Each of the unit pixels PX1, PX5, and PX9 may include a color filter 202, a light transmitting layer 203, and a micro lens 204 on the second surface of the substrate 201. Light passing through a single microlens 204 may be incident on the photodiodes PD1, PD5, and PD9.

In some embodiments, as shown in FIG. 17B, and in contrast to FIG. 17A, the device isolation layer 210 of the region excluding the COB regions W1 and W4 may be FDTI, and device isolation layers 250 of the COB regions W1 and W4 may be BDTI. COBs W1-W4 may be formed below the BDTI in the COB regions W1 and W4.

The device isolation layer 210 in regions other than the COB regions W1 and W4 may optically separate a plurality of pixel groups from each other, and the device isolation layer 250 in the COB regions W1 and W4 may increase the sensitivity of the image sensor. The FDTI formed in the regions other than the COB regions W1 and W4 may include polysilicon, and the BDTI formed in the COB regions W1 and W4 may include a metal oxide, for example, hafnium oxide corresponding to a high-k dielectric (HfO). Accordingly, the BDTI may have a relatively high reflectance compared to the FDTI. The COB regions W1 and W4 may correspond to middle portions in which light is collected, and the sensitivity of the image sensor may be increased by forming a BDTI having high reflectivity in the COB regions W1 and W4.

Referring to FIG. 17C, the device isolation layer 210 in the region except for the COB regions W1 and W4 may extend from the upper surface to the bottom surface of the substrate in the third direction (e.g., the Z-axis direction) perpendicular to the upper surface of the substrate.

Figure 18:
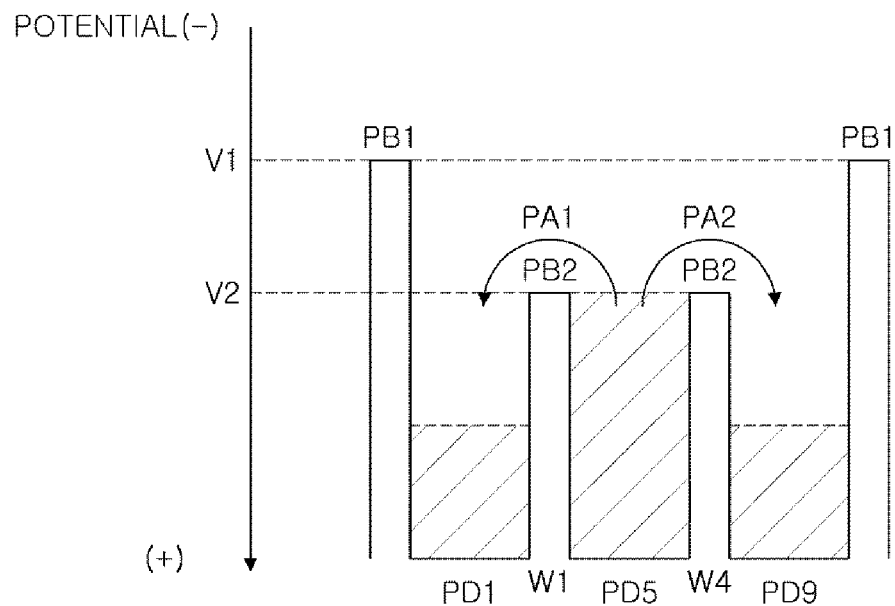
FIG. 18 is a diagram illustrating a potential level of an image sensor according to some example embodiments.

FIG. 18 is a diagram illustrating a potential level of an image sensor according to an example embodiment. Referring to FIG. 18, in an optical integration mode in which electrons are integrated into the photodiodes PD1, PD5, and PD9, a first path PA1 and a second path PA2 may indicate passages through which charges additionally generated by the saturated photodiode move.

Referring to FIGS. 17A and 18, the device isolation layer 210 may provide a first potential barrier PB1 between a plurality of pixel groups. In the optical integration mode, the device isolation layer 210 may have a first potential level V1.

The COBs W1 and W4 may provide a second potential barrier PB2 between the first photodiode and the fifth photodiode and between the fifth photodiode and the ninth photodiode. In the optical integration mode, the COB regions W1 and W4 may have a second potential level V2.

The second potential barrier PB2 may be lower than the first potential barrier PB1, and the second potential level V2 may be higher than the first potential level V1, which may indicate that the lower the potential level, the higher the energy of the electric charge.

Charges may be integrated in the photodiodes by light incident on the photodiodes PD1, PD5, and PD9 during the light integration mode. When light of reference illuminance or more is incident on the photodiodes PD1, PD5, and PD9 during the optical integration mode, electrons greater than or equal to full well capacity of the photodiodes PD1, PD5, and PD9 may be generated. Accordingly, electrons additionally generated in one saturated photodiode, e.g., the fifth photodiode PD5, may pass through the first path PA1 and the second path PA2 and move to other photodiodes (e.g., the first photodiode and the ninth photodiode). Since no signal loss occurs, an image having significantly increased sensitivity may be obtained.

Figure 19:
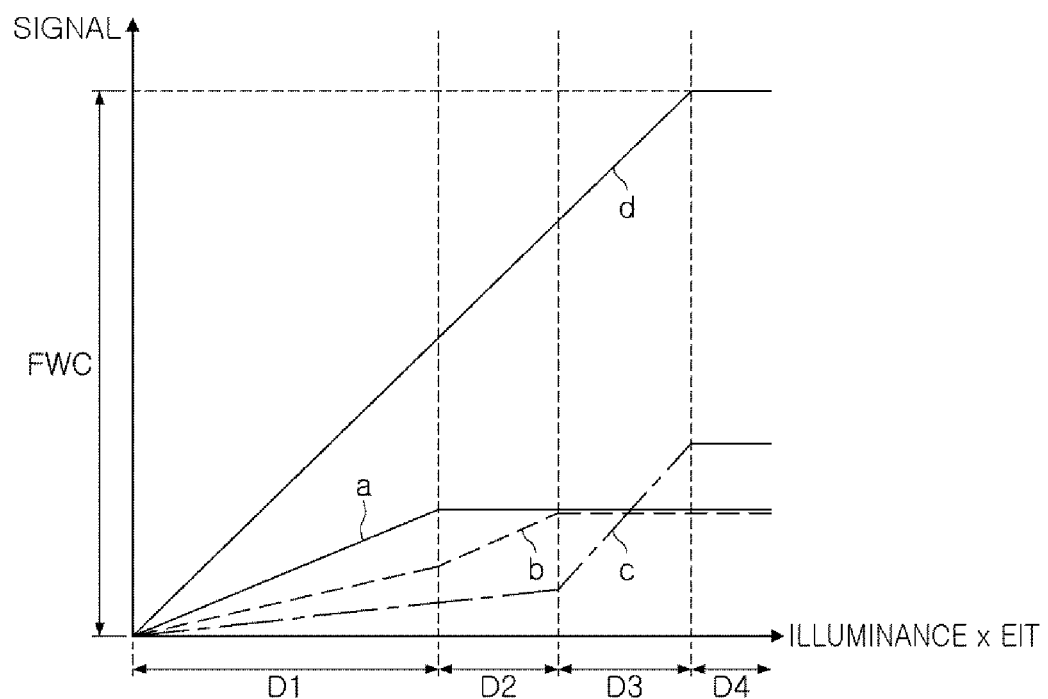
FIG. 19 illustrates an output signal according to an amount of light from the image sensor of FIG. 18.

FIG. 19 illustrates an output signal according to an amount of light from the image sensor of FIG. 18.

The X-axis of FIG. 19 indicates an exposure time, and may indicate a product of an effective integration time (EIT) and illuminance. The Y-axis represents the signal output by the pixel. A first signal (a) may indicate the number of electrons integrated in the fifth photodiode PD5, a second signal (b) may indicate the number of electrons integrated in the first photodiode PD1, and a third signal (c) may indicate the number of electrons integrated in the ninth photodiode PD9. A fourth signal (d) may indicate the sum of the first signals (a) to the third signals (c), for example, the sum of the number (a) of electrons integrated in the first photodiode PD1, the number (b) of electrons integrated in the fifth photodiode PD5, the number (c) of electrons integrated in the ninth photodiode PD9.

The period in which the fourth signal (d) linearly increases with a first slope may include a first time D1, a second time D2, and a third time D3. The full well capacity (FWC) of the pixel may be a maximum number of electrons that may be output by the pixel during the first time D1, the second time D2, and the third time D3 when the fourth signal (d) has linearity. Accordingly, the full well capacity (FWC) of the pixel may be greater than the maximum well capacity of the unit pixel.

FIG. 20A is a drawing illustrating a comparative example, to describe the effect of the image sensor according to an example embodiment, and FIG. 20B is a diagram illustrating the effect of the image sensor according to an example embodiment of the present inventive concept. In the graphs of FIGS. 20A and 20B, the X-axis represents the position of the image sensor in the X-axis direction, and the Y-axis represents the amount of light received by a unit pixel, for example, the amount of light.

As the pixel group is positioned from a first direction (e.g., left direction) to a second direction (e.g., right direction) in the image sensor, an amount (L) of first light generating the first image data (e.g., left image data) in the pixel group may be increased, and an amount (R) of second light generating second image data (e.g., right image data) in the pixel group may decrease.

FIG. 20A is a comparative embodiment of an image sensor including unit pixels in which a pixel group is arranged in a 2×2 form, and FIG. 20B is an embodiment of an image sensor according to the present inventive concepts.

Comparing FIGS. 20A and 20B, a second width W2 corresponding to the difference between a highest point of the first light amount L and a highest point of the second light amount R may be wider than a first width W1. Accordingly, in the example embodiments according to the present disclosure, distance data may be obtained even at a greater distance than that in the comparative embodiment.

A second height H2 corresponding to a difference between a lowest point of the first light amount L and the highest point of the second light amount R may be greater than a first height H1. The separation ratio of the second embodiment is greater than that of the first embodiment, and thus, the autofocusing performance of the example embodiments according to the present disclosure may be improved than that of the comparative embodiment, and the autofocusing function may be performed even in a dark or dimly lit place.

In addition, in the example embodiments according to the present disclosure, since the image in the first direction (e.g., the left direction) and the image in the second direction (e.g., the right direction) are sharply discriminated, there is an effect of clear phase separation by light.

Fifth Embodiment

FIG. 21 is a block diagram illustrating an image sensor according to some example embodiments, and FIG. 22 is a diagram schematically illustrating a circuit of a pixel group included in the image sensor according to some example embodiments.

Referring to FIG. 21, an image sensor 2 according to some example embodiments may further include a binning controller 53 and a binning circuit 55, in contrast to FIG. 1. The binning controller 53 may control the binning circuit 55.

The example embodiments of image sensors described above with reference to FIGS. 1 to 20 are examples in which unit pixels included in one pixel group share one floating diffusion region, and charges generated from photodiodes are summed (or averaged) in the floating diffusion region. On the other hand, the binning circuit 55 of FIG. 21 may calculate a reset sum value by summing (or averaging) reset voltages detected from the unit pixels, and may calculate a reset sum value by summing (or averaging) pixel voltages detected from the unit pixels.

In contrast to the circuit of FIG. 4, in the case of the circuit of FIG. 22 in a pixel group according to some example embodiments, the first to third unit pixels of the first subgroup may share a first floating diffusion region FD1, the fourth to sixth unit pixels of the second subgroup may share a second floating diffusion region FD2, and the seventh to ninth unit pixels of the third subgroup may share a third floating diffusion region FD3.

According to some example embodiments, a column line COL may be provided for each subgroup, and since pixel signals may be simultaneously acquired for each subgroup, the readout speed may be rapidly improved.

According to some example embodiments, not all of the unit pixels included in one pixel group may share a floating diffusion region in common with each other. The binning circuit may calculate a first reset sum value by summing the first to third reset voltages detected from the first to third unit pixels, and may calculate a first pixel sum value by summing the first to third pixel voltages detected from the first to third unit pixels. The control logic may generate first image data corresponding to the first to third unit pixels.

The binning circuit may calculate a second reset sum value by summing the fourth to sixth reset voltages detected from the fourth to sixth unit pixels, and may calculate a second pixel sum value by summing the fourth to sixth pixel voltages detected from the fourth to sixth unit pixels. The control logic may generate second image data corresponding to the fourth to sixth unit pixels.

The binning circuit may calculate a third reset sum value by summing the seventh to ninth reset voltages detected from the seventh to ninth unit pixels, and may calculate a third pixel sum value by summing the seventh to ninth pixel voltages detected from the seventh to ninth unit pixels. The control logic may generate third image data corresponding to the seventh to ninth unit pixels.

The signal processing circuit may generate an image using the first to third image data, calculate a disparity using the first image data and the third image data, detect a phase difference in a first direction (e.g., a vertical direction) using the calculated disparity, and obtain autofocusing and distance data from the phase difference.

In the binning mode, as the number of unit pixels sharing the floating diffusion region increases, the number of times the readout circuit reads a pixel signal may decrease. Therefore, as the number of unit pixels sharing the floating diffusion region increases, the read noise characteristic may be advantageous.

Other Embodiments

Figure 23A:
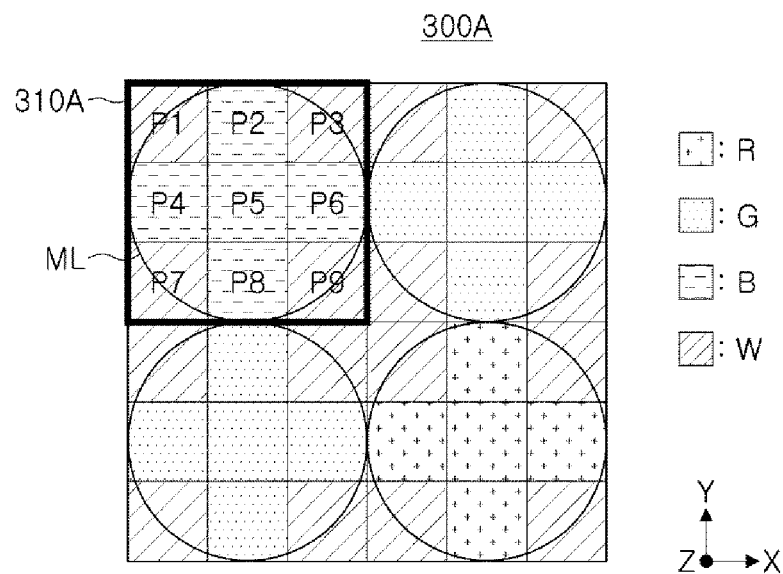
FIGS. 23A to 23C are diagrams illustrating pixel arrays of an image sensor according to some example embodiments.
Figure 23B:
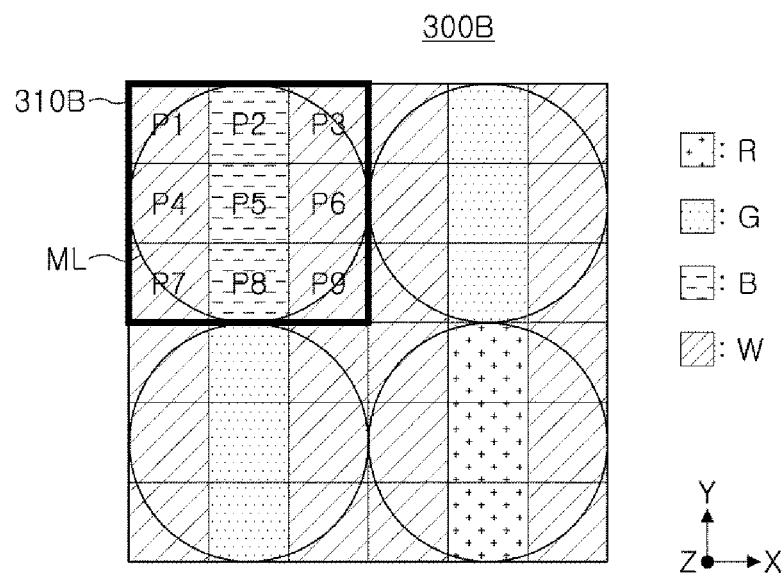
Figure 23C:
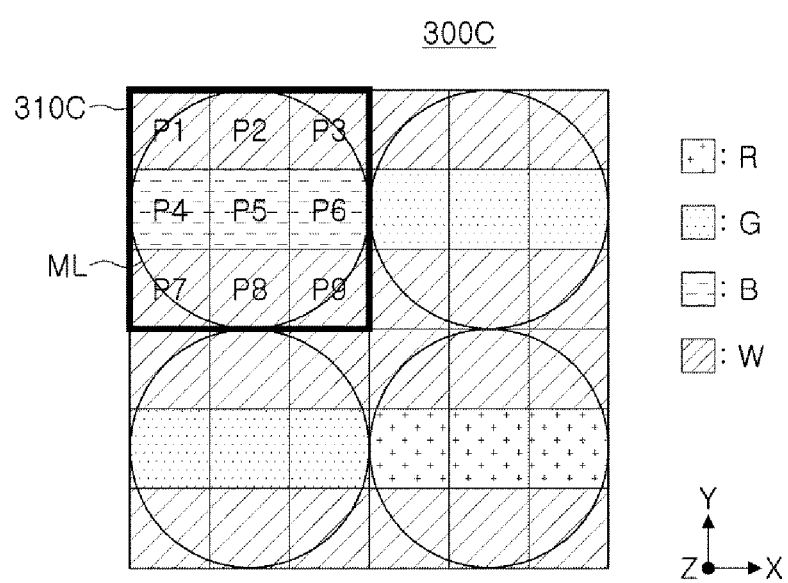

FIGS. 23A to 23C are diagrams illustrating a pixel array of an image sensor according to some example embodiments.

Referring to FIG. 23A, a color filter of a portion of a plurality of unit pixels of one pixel group 310A may be a white (W) filter. For example, in one pixel group 310A, a first unit pixel P1, a third unit pixel P3, a seventh unit pixel P7, and a ninth unit pixel P9 positioned at the corners may include a white filter. Since light may be relatively weakly incident on the remaining regions other than the middle region where the light is focused, the sensitivity of the image sensor may be improved by locating the white filter in the unit pixels positioned at the corners.

Autofocusing and distance data may be obtained using the first unit pixel P1, the third unit pixel P3, the seventh unit pixel P7, and the ninth unit pixel P9, which may have relatively high sensitivity, and an image may be generated using all unit pixels through color interpolation.

Referring to FIG. 23B, in contrast to FIG. 23A, a white filter may be in the first unit pixel P1, the fourth unit pixel P4, the seventh unit pixel P7, the third unit pixel P3, the sixth unit pixel P6 and the ninth unit pixel P9, positioned at the left and right edges. Accordingly, autofocusing performance in the horizontal direction may be improved.

Referring to FIG. 23C, in contrast to FIG. 23A, a white filter may be in the first unit pixel P1, the second unit pixel P2, the third unit pixel P3, the seventh unit pixel P7, the eighth unit pixel P8, and the ninth unit pixel P9 at the upper and lower edges. Accordingly, the autofocusing performance in the vertical direction may be improved.

Figure 24:
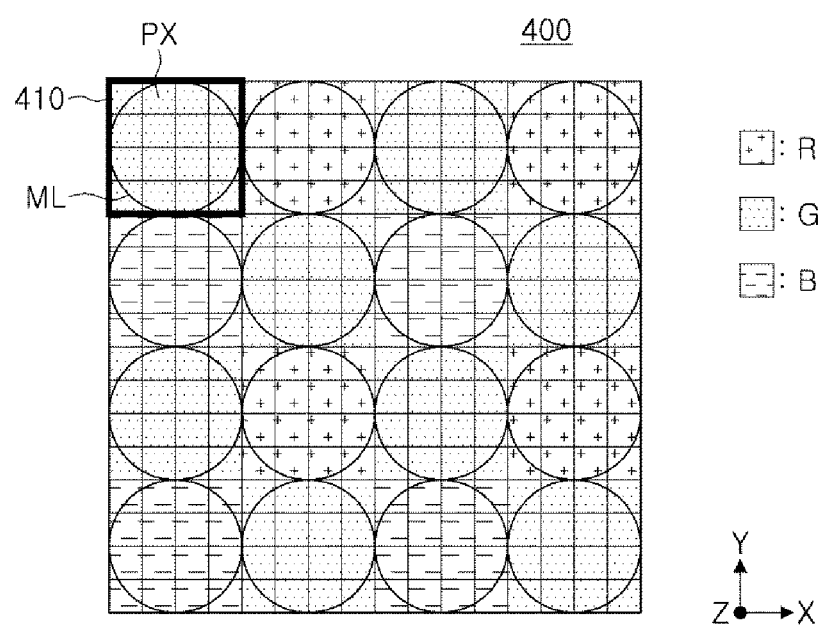
FIG. 24 is a diagram illustrating a pixel array of an image sensor according to some example embodiments.

FIG. 24 is a diagram illustrating a pixel array of an image sensor according to some example embodiments.

Referring to FIG. 24, in a pixel array 400 of an image sensor according to some example embodiments, and in contrast FIG. 3, each of a plurality of pixel groups 410 may include first to sixteenth unit pixels PX.

The first to sixteenth unit pixels PX in one pixel group 410 may share one micro lens ML. The first to sixteenth unit pixels PX may respectively include a color filter having the same color as each other. Each of the first to sixteenth unit pixels PX may include at least one photodiode, and at least some of the first to sixteenth unit pixels PX may share one floating diffusion region.

Figure 25A:
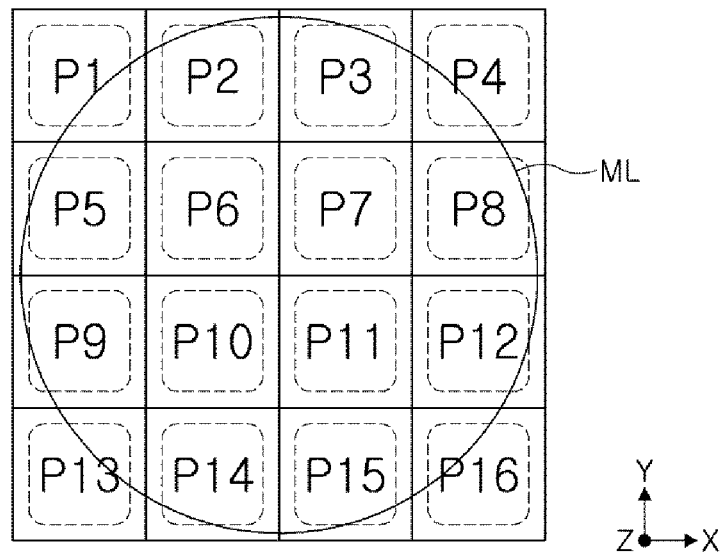
FIGS. 25A and 25B are diagrams illustrating a method of operating an image sensor according to some example embodiments.
Figure 25B:
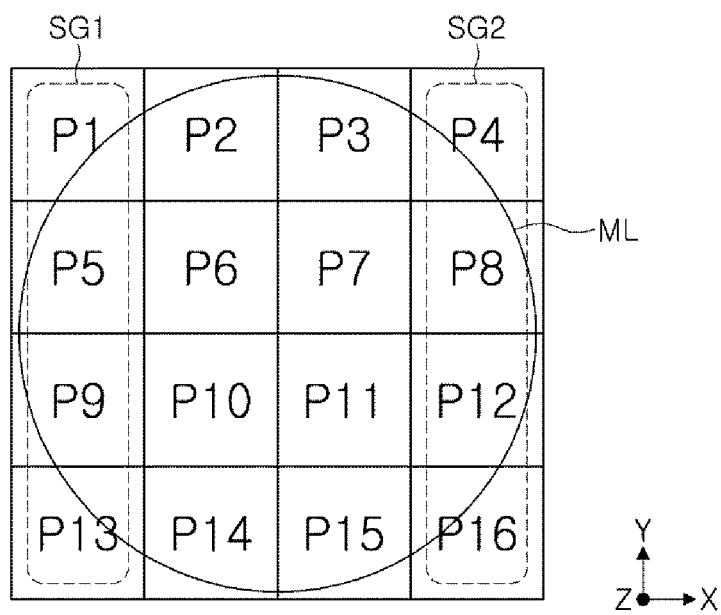

FIGS. 25A and 25B are diagrams illustrating a method of operating an image sensor according to some example embodiments.

Referring to FIG. 25A, a signal processing circuit may receive image data corresponding to the first to sixteenth unit pixels respectively and generate an image from each of the image data. Accordingly, an image having high resolution may be generated.

Referring to FIG. 25B, the first unit pixel P1, the fifth unit pixel P5, the ninth unit pixel P9, and the thirteenth unit pixel P13 may constitute a first subgroup SG1. In addition, the fourth unit pixel P4, the eighth unit pixel P8, the twelfth unit pixel P12, and the sixteenth unit pixel P16 may constitute a second subgroup SG2. The signal processing circuit may generate first image data by summing image data corresponding to the first unit pixel P1, the fifth unit pixel P5, the ninth unit pixel P9, and the thirteenth unit pixel P13 respectively, and may generate second image data by summing image data corresponding to the fourth unit pixel P4, the eighth unit pixel P8, the twelfth unit pixel P12, and the sixteenth unit pixel P16 respectively. The signal processing circuit may calculate a disparity by using the first image data corresponding to the first subgroup SG1 and the second image data corresponding to the second subgroup SG2. The signal processing circuit may detect a phase difference in a first direction (e.g., a horizontal direction) using the calculated disparity, and may obtain autofocusing and distance data from the phase difference.

FIGS. 25A and 25B illustrate example embodiments in which an image is generated in the pull mode and autofocusing and distance data in the first direction are obtained, but the present inventive concepts are not limited to the example embodiments, and may be modified in various manners within a range that may be easily understood by a person skilled in the art.

Figure 26:
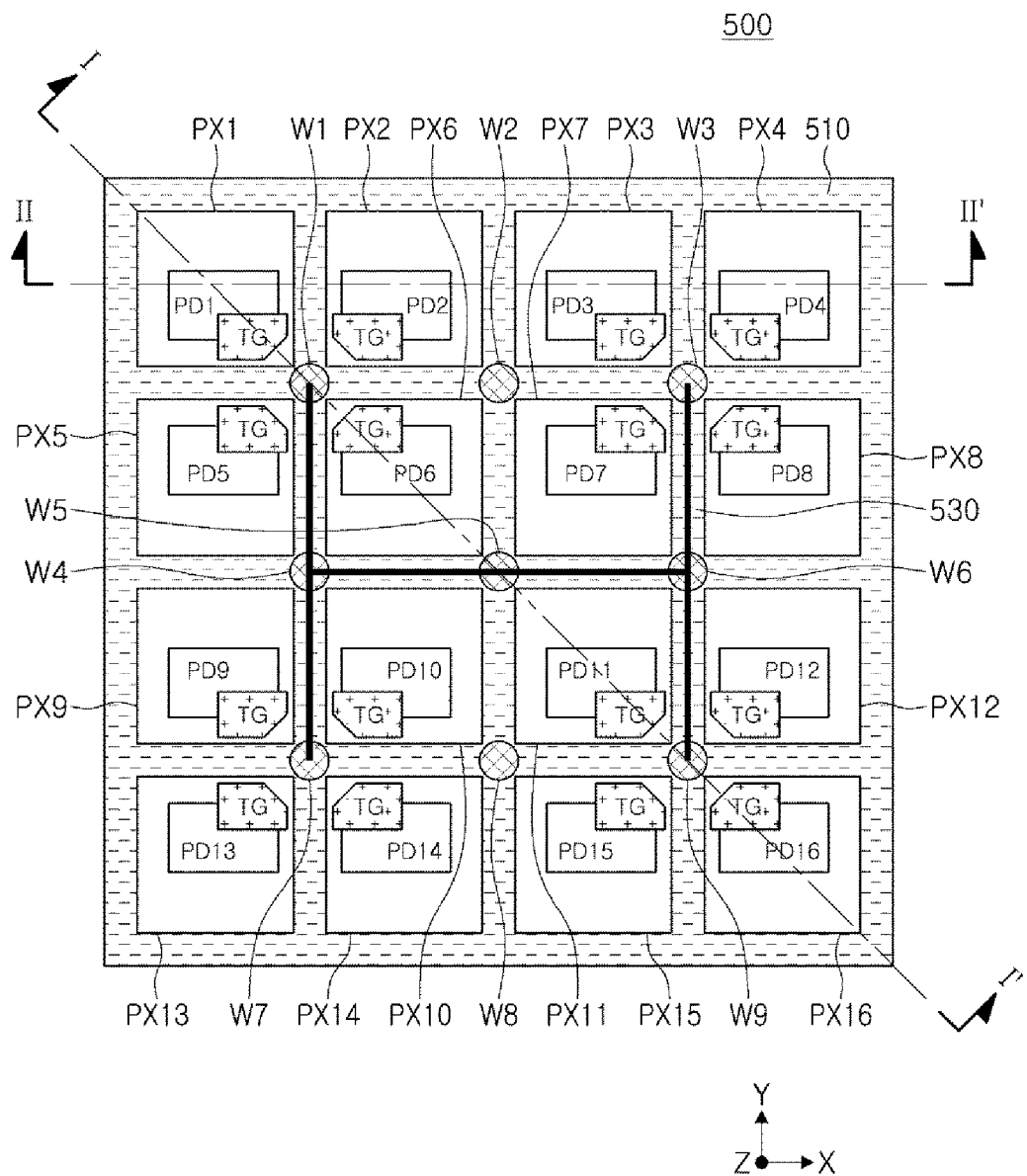
FIG. 26 is a plan view schematically illustrating a pixel included in an image sensor according to some example embodiments.

FIG. 26 is a plan view schematically illustrating a pixel included in an image sensor according to some example embodiments.

Referring to FIG. 26, and with focus on differences from FIG. 16, in a pixel array 500 according to some example embodiments, the first to sixteenth unit pixels PX1 to PX16 may constitute one pixel group. A device isolation layer 510 may extend in a third direction (e.g., the Z-axis direction) perpendicular to the upper surface of the substrate. The device isolation layer 510 may provide a first potential barrier between adjacent pixel groups. For example, the device isolation layer 510 may be FDTI or BDTI.

The first to sixteenth pixels PX1 to PX16 may include an active region formed by doping a semiconductor substrate with impurities, photodiodes PD1 to PD16, and a plurality of gates. The plurality of gates may be combined with the active region to provide a plurality of transistors included in the pixel circuit. FIG. 26 illustrates only a transfer gate TG of the plurality of transistors in each of the first to sixteenth pixels PX1 to PX16, but each of the first to sixteenth pixels PX1 to PX16 may include at least one of a driving gate, a selection gate, and/or a dummy gate.

Although not illustrated, the floating diffusion regions formed in the first to sixteenth pixels PX1 to PX16, respectively, may be electrically connected to each other by at least one of wiring patterns 530.

In some embodiments, COBs W1-W9 may be formed between the first to sixteenth unit pixels PX1-PX16. Charges may move between the photodiodes PD1-PD9 of one pixel group through the COBs W1-W9. In some example embodiments, in which the device isolation layer 510 is an FDTI, when the device isolation layer 510 is formed, the FDTI may not be formed in the COB regions W1-W9. Thereafter, when the photodiodes PD1-PD16 are formed through the ion implantation process, the COBs W1-W9 may be formed together in the COB regions W1-W9, and the COBs W1-W9 may have a PN junction structure.

In some example embodiments, in which the device isolation layer 510 is BDTI, when the device isolation layer 510 is formed, in the third direction (e.g., the Z-axis direction) perpendicular to the upper surface of the substrate, device isolation layers having different lengths may be formed in the COB regions W1-W9 and regions other than the COB regions W1-W9. A first length of the device isolation layer formed in the COB region W1-W9 in the third direction (e.g., the Z-axis direction) may be less than a second length of the device isolation layer formed in the region other than the COB region W1-W9. Thereafter, when the photodiodes PD1-PD16 are formed through the ion implantation process, the COBs W1-W9 may be formed together in the COB regions W1-W9.

In some example embodiments, an FDTI having a second length may be formed in a region excluding the COB region W1-W9, and a BDTI having a first length shorter than the second length may be formed in the COB region W1-W9. Thereafter, when the photodiodes PD1-PD16 are formed through the ion implantation process, the COBs W1-W9 may be formed together in the COB regions W1-W9.

The COBs W1-W9 may provide a second potential barrier between adjacent unit pixels PX. The second potential barrier provided by the COBs W1-W9 may be lower than the first potential barrier provided by the device isolation layer 510. Accordingly, charges may move between the photodiodes PD1-PD16 of one pixel group through the COBs W1-W9.

Figure 27A:
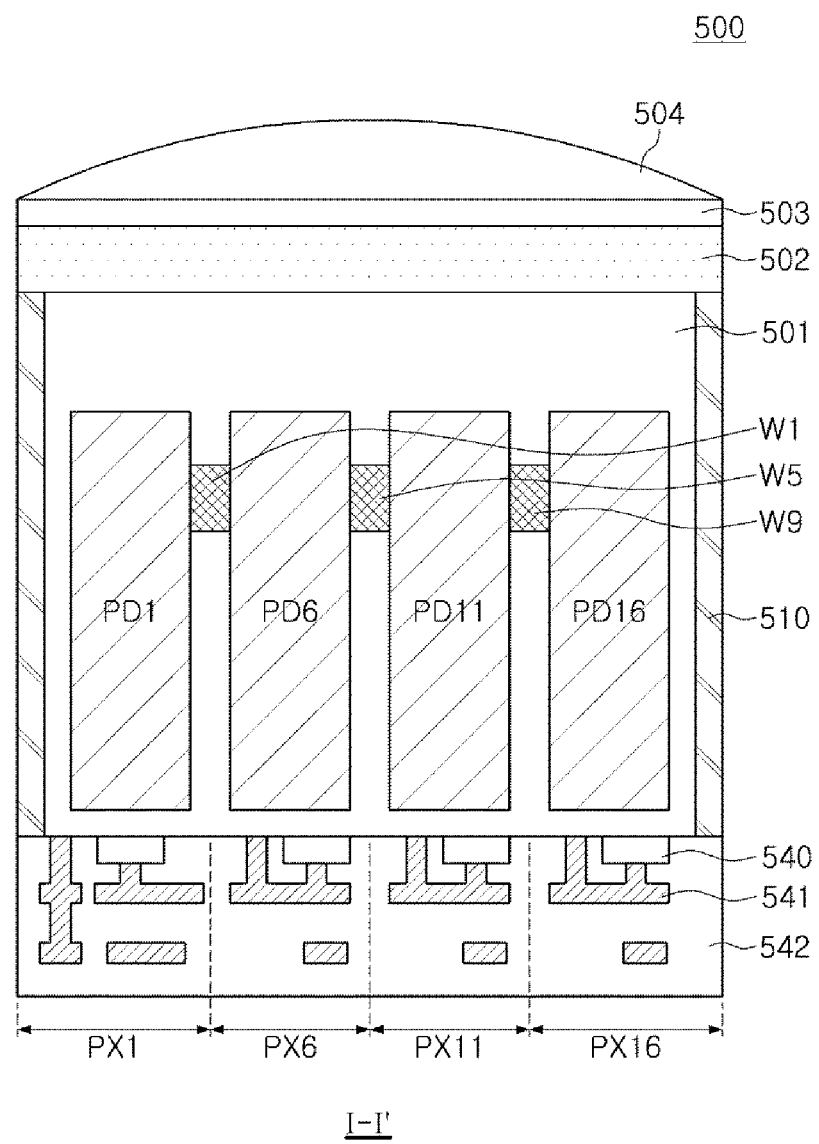
FIG. 27A is a cross-sectional view illustrating a cross-section of the image sensor illustrated in FIG. 26 taken in the I-I' direction.
Figure 27B:
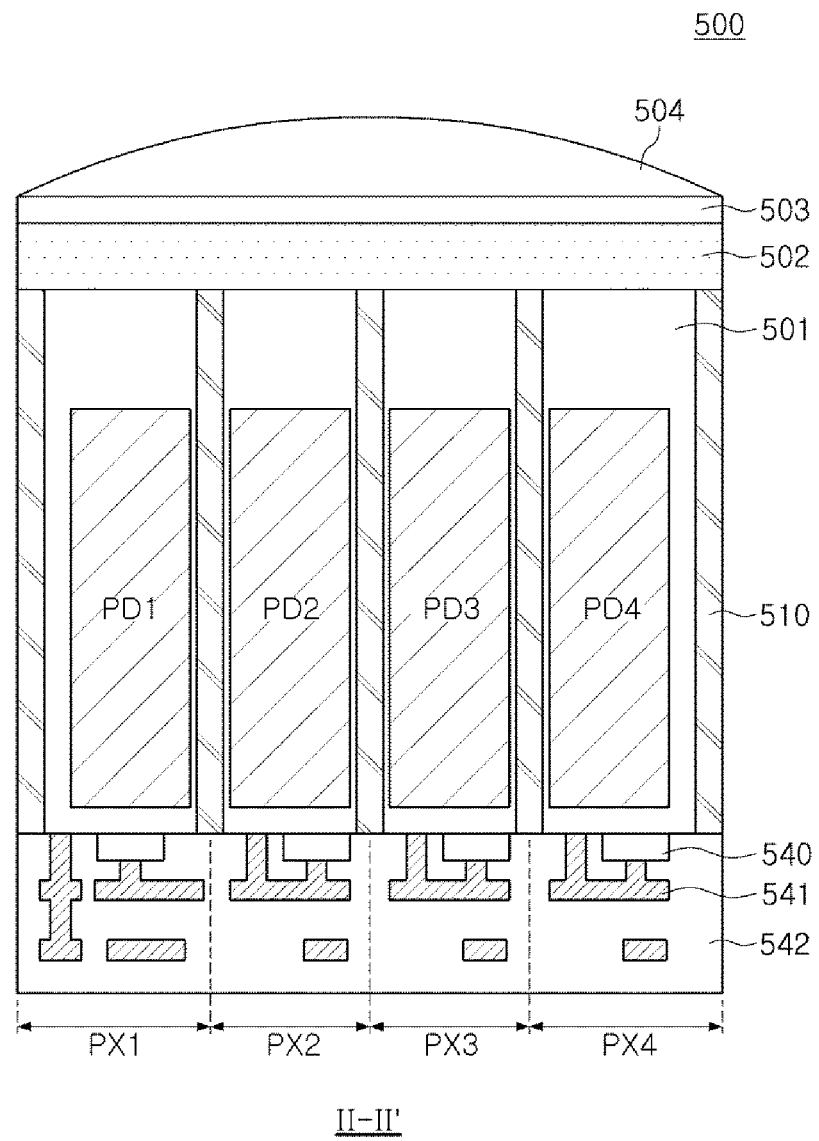
FIG. 27B is a cross-sectional view illustrating a cross section of the image sensor illustrated in FIG. 26 taken in the II-IP direction.

FIG. 27A is a cross-sectional view illustrating a cross-section of the image sensor illustrated in FIG. 26 taken in the I-I' direction, and FIG. 27B is a cross-sectional view illustrating a cross-section of the image sensor illustrated in FIG. 26 taken in the II-II' direction.

Referring to FIG. 27A, a device isolation layer 510 may be between pixel groups, and COBs W1, W5, and W9 may be formed between the photodiodes PD1, PD6, PD11, and PD16. For example, the device isolation layer 210 may be FDTI, and the COBs W1, W5, and W9 may have a PN junction structure.

Each of the unit pixels PX1, PX6, PX11, and PX16 may include a color filter 502, a light transmitting layer 503, and a micro lens 504 on the second surface of the substrate 501. Light passing through a single microlens 504 may be incident on the photodiodes PD1, PD6, PD11, and PD16.

Referring to FIG. 27B, the device isolation layer 510 in the region excluding the COB (W1, W5, W9) may extend from the upper surface to the lower surface of the substrate in the third direction (e.g., the Z-axis direction) perpendicular to the upper surface of the substrate.

Figure 28:
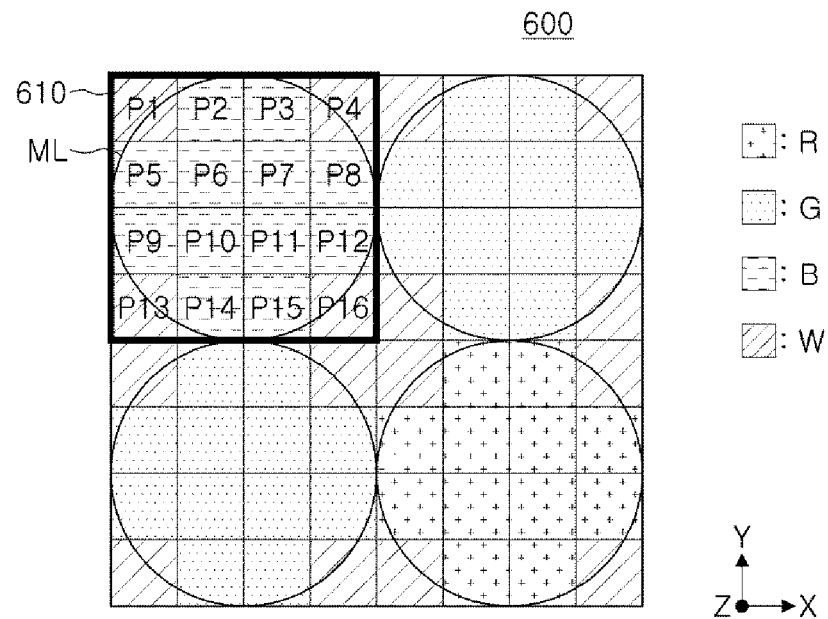
FIG. 28 is a diagram illustrating a pixel array of an image sensor according to some example embodiments.

FIG. 28 is a diagram illustrating a pixel array of an image sensor according to some example embodiments.

Referring to FIG. 28, a color filter of a portion of a plurality of unit pixels of a pixel group 610 may be a white (W) filter. For example, in one pixel group 610, the first unit pixel P1, a fourth unit pixel P4, a thirteenth unit pixel P13, and a sixteenth unit pixel P16 positioned at the corners may include a white filter. Since light may be relatively weakly incident on the remaining regions other than the middle region where the light is focused, the sensitivity of the image sensor may be improved by arranging the white filter in the unit pixels positioned at the corners.

Figure 29:
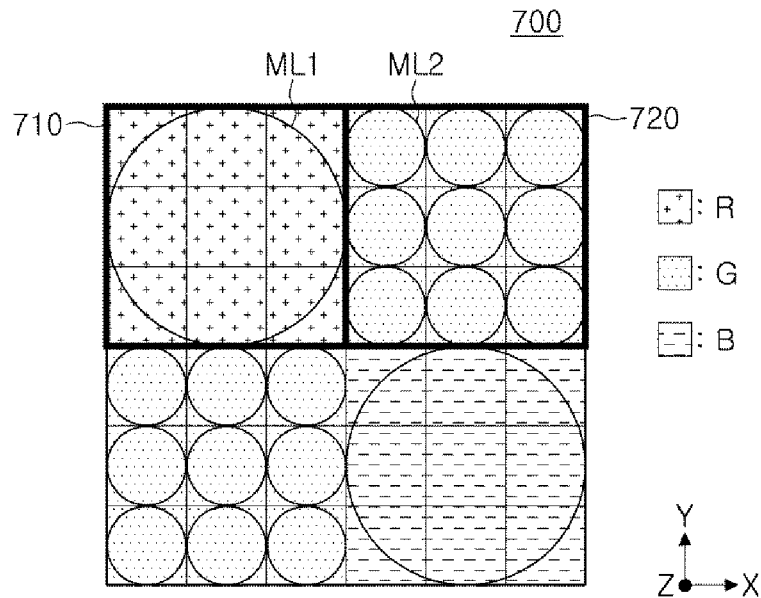
FIG. 29 is a diagram illustrating a pixel array of an image sensor according to some example embodiments.

FIG. 29 is a diagram illustrating a pixel array of an image sensor according to some example embodiments.

Referring to FIG. 29, a first pixel group 710 may include first to ninth unit pixels PX, similar to the pixel group 110 of FIG. 3, and the first to ninth unit pixels (PX) may share one micro lens ML. The first to ninth unit pixels may respectively include a color filter having the same color as each other. In a second pixel group 720, each of the first to ninth unit pixels PX may include a micro lens ML, in contrast to the first pixel group 710.

Accordingly, the first pixel group 710 and the second pixel group 720 may be used for image generation, while only the first pixel group 710 may provide autofocusing and distance data. When the first pixel group 710 is used for image generation and the second pixel group 720 is used to provide autofocusing and distance data, the signal processing circuit may perform lens shading correction and/or bad pixel correction, or the like.

Figure 30:
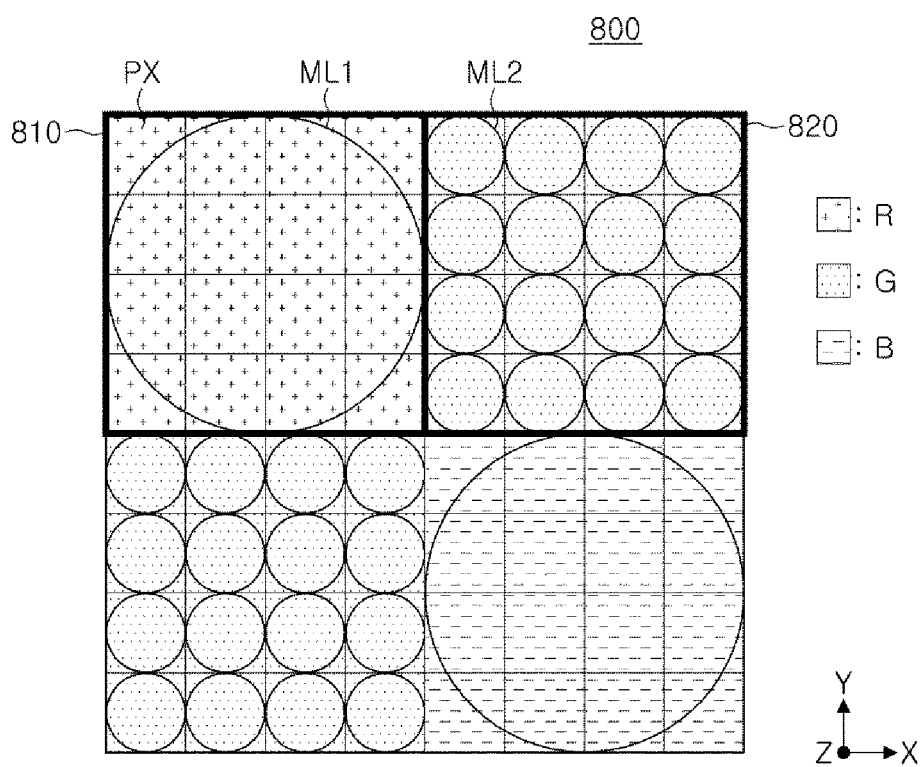
FIG. 30 is a diagram illustrating a pixel array of an image sensor according to some example embodiments.

FIG. 30 is a diagram illustrating a pixel array of an image sensor according to some example embodiments.

Referring to FIG. 30, similarly to FIG. 29, a first pixel group 810 may include first to sixteenth unit pixels PX, and the first to sixteenth unit pixels PX may share one micro lens ML. The first to sixteenth unit pixels may respectively include a color filter having the same color as each other. In a second pixel group 820, each of the first to sixteenth unit pixels PX may include a micro lens ML, unlike the first pixel group 810.

Figure 31:
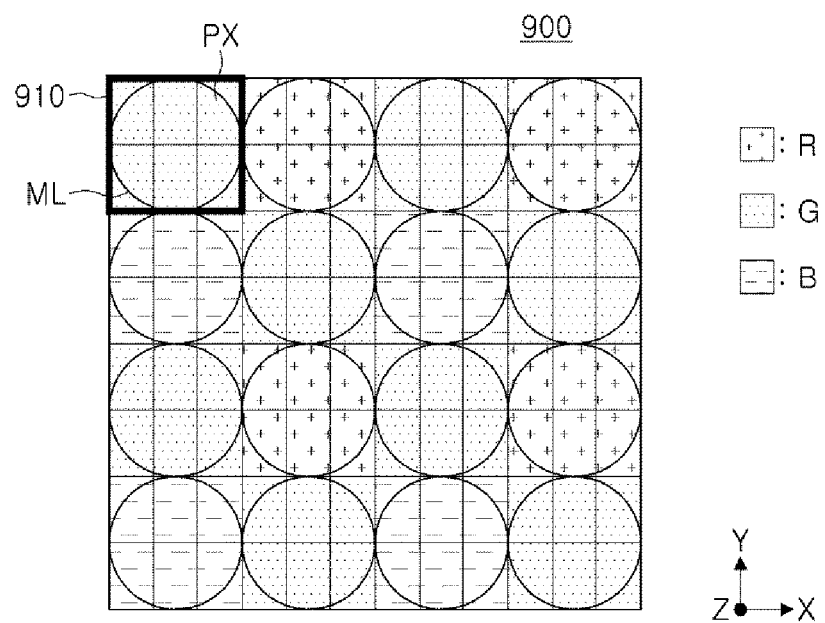
FIG. 31 is a diagram illustrating a pixel array of an image sensor according to some example embodiments.
Figure 32:
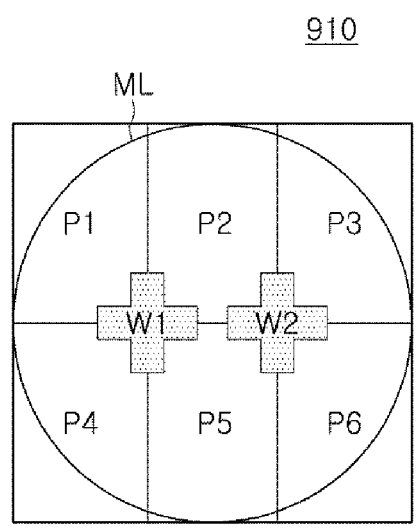
FIG. 32 is a plan view schematically illustrating pixels included in an image sensor according to some example embodiments.

FIG. 31 is a diagram illustrating a pixel array of an image sensor according to some example embodiments, and FIG. 32 is a plan view schematically illustrating pixels included in an image sensor according to some example embodiments.

Referring to FIG. 31, a pixel group 910 may include first to sixth unit pixels PX, and a photodiode of each of the first to sixth unit pixels PX may be vertically or horizontally asymmetrical. The first to sixth unit pixels PX may share one micro lens ML, and the first to sixth unit pixels may respectively include a color filter of the same color.

When generating an image, the image sensor may generate an image by summing pixel signals of the first to sixth unit pixels PX, and when providing autofocusing and distance data, the image sensor may detect a phase difference in a first direction (e.g., X-axis direction) and may provide autofocusing and distance data from the phase difference.

Referring to FIG. 32, COBs W1 and W2 may be formed between the first to sixth unit pixels P1 to P6, and the COBs W1 and W2 may have a PN junction structure. Charges may move between the photodiodes of one pixel group through the COBs W1 and W2.

Figure 33:
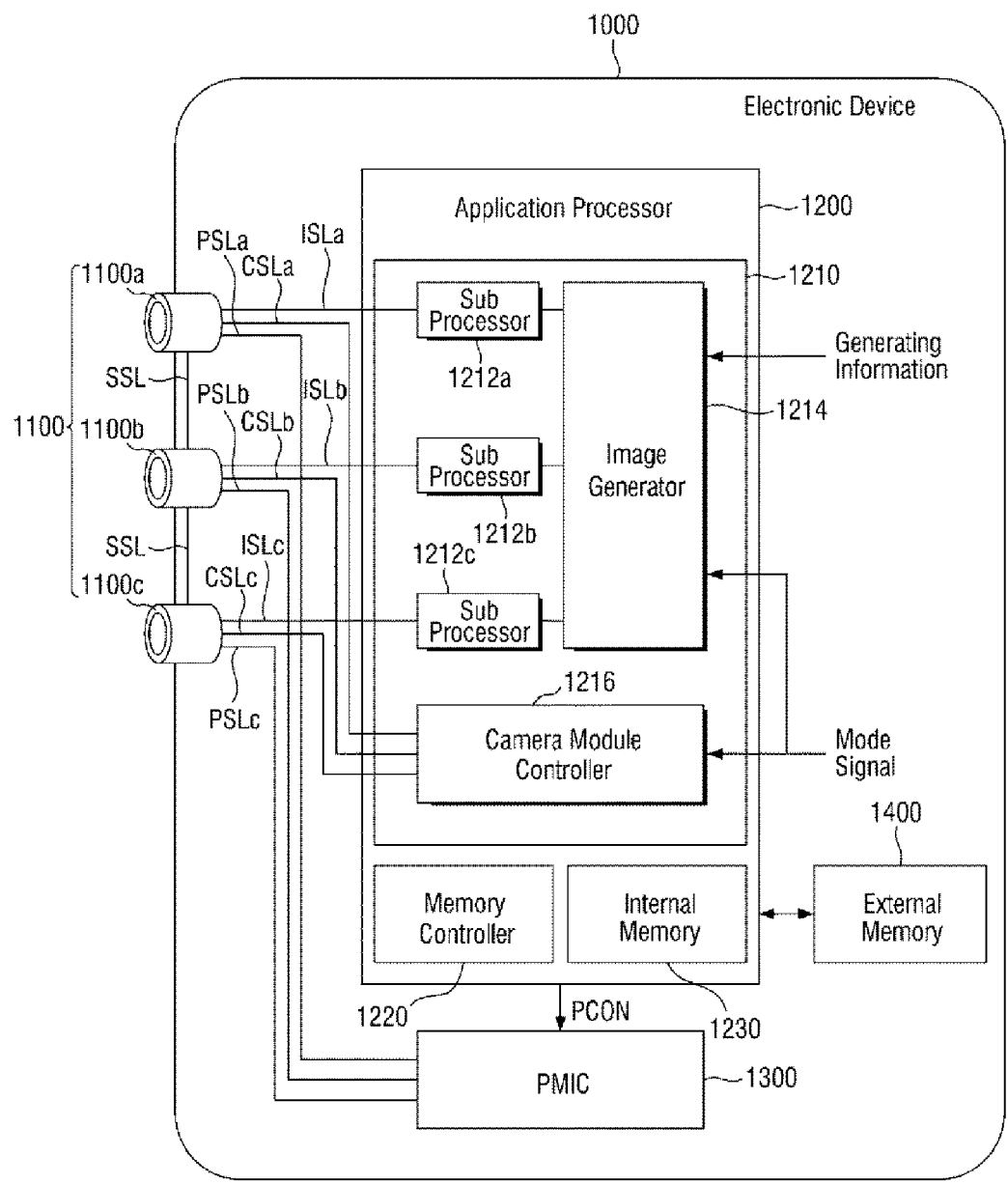
FIGS. 33 and 34 are diagrams schematically illustrating an electronic device including an image sensor according to some example embodiments.
Figure 34:
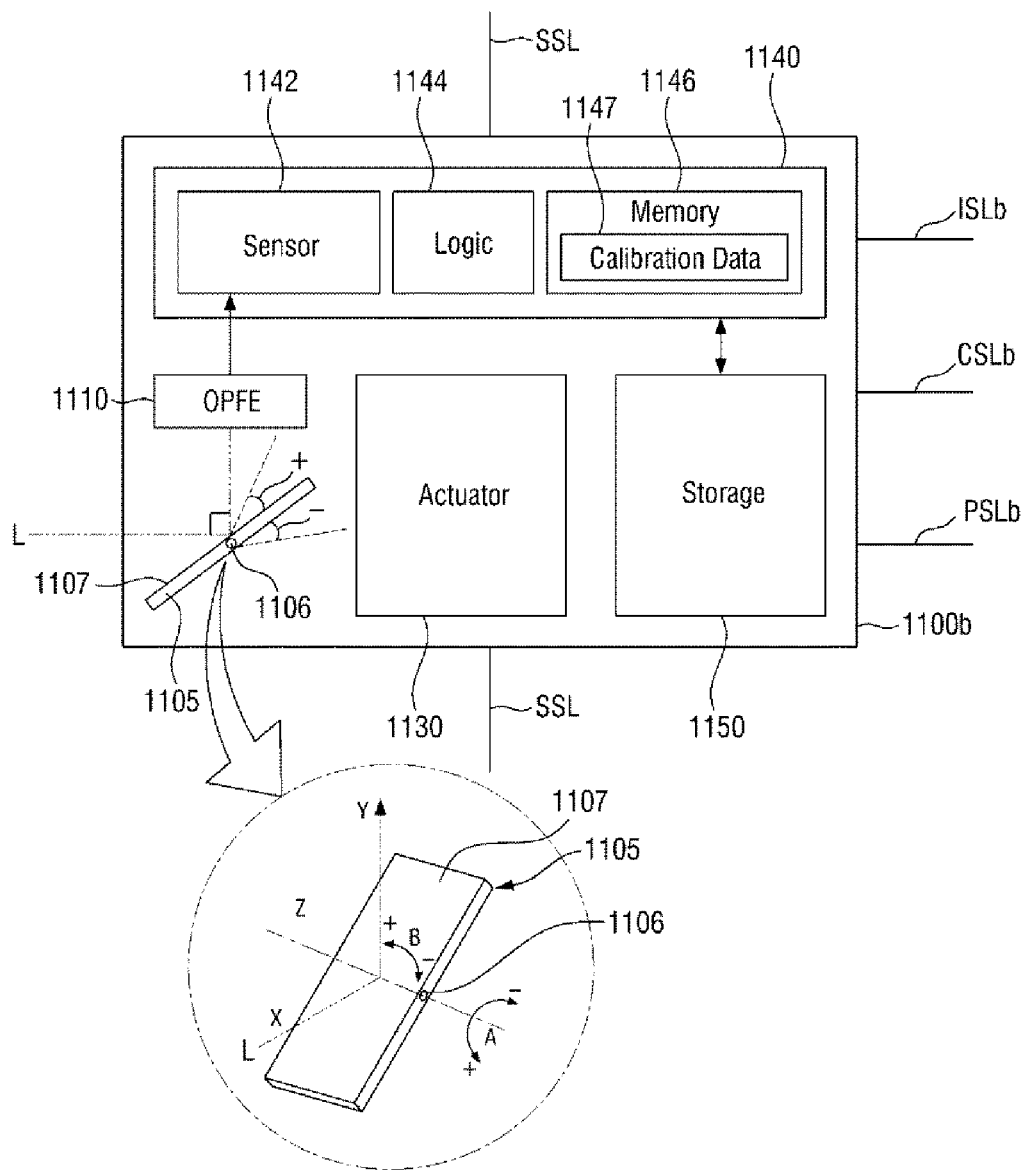

FIGS. 33 and 34 are diagrams schematically illustrating an electronic device including an image sensor according to some example embodiments.

Referring to FIG. 33, an electronic device 1000 may include a camera module group 1100, an application processor 1200, a PMIC 1300, and an external memory 1400.

The camera module group 1100 may include a plurality of camera modules 1100a, 1100b, and 1100c. Although the drawing illustrates an example embodiment in which three camera modules 1100a, 1100b, and 1100c are arranged, the present disclosure is not limited thereto. In some example embodiments, the camera module group 1100 may be modified to include only two camera modules. In addition, in some example embodiments, the camera module group 1100 may be modified and implemented to include n (where n is a natural number of 4 or more) camera modules. In addition, in some example embodiments, at least one of the plurality of camera modules 1100a, 1100b, and 1100c included in the camera module group 1100 may include an image sensor according to one of the example embodiments described above with reference to FIGS. 1 to 32.

Hereinafter, a detailed configuration of the camera module 1100b will be described in more detail with reference to FIG. 34, but the following description may be equally applied to other camera modules 1100a and 1100b according to some example embodiments.

Referring to FIG. 34, the camera module 1100b may include a prism 1105, an optical path folding element (hereinafter referred to as "OPFE") 1110, an actuator 1130, an image sensing device 1140, and a storage unit 1150.

The prism 1105 may include a reflective surface 1107 of a light reflecting material to change the path of light L incident from the outside.

In some example embodiments, the prism 1105 may change the path of the light L, incident in the first direction X, to the second direction Y, perpendicular to the first direction X. In addition, the prism 1105 may rotate the reflective surface 1107 of the light reflecting material in A direction around a central axis 1106, or may rotate the central axis 1106 in B direction, to change the path of the light L incident in the first direction X to be incident in the second direction, a vertical direction. In this case, the OPFE 1110 may also move in a third direction Z, perpendicular to the first direction X and the second direction Y.

In some embodiments, as illustrated, a maximum rotation angle of the prism 1105 in the A direction may be 15 degrees or less in the positive (+) A direction, and may be greater than 15 degrees in the negative (-) A direction, but example embodiments are not limited thereto.

In some example embodiments, in the positive (+) or negative (-) B direction, the prism 1105 may move between 20 degrees, or between 10 degrees and 20 degrees, or between 15 degrees and 20 degrees, and in this case, the angle of movement may be at the same angle thereas, in the positive (+) or negative (-) B direction, or may be almost the same angle thereas in the range of around 1 degree.

In some embodiments, the prism 1105 may move the reflective surface 1106 of the light reflective material in a third direction (e.g., the Z direction) parallel to the extending direction of the central axis 1106.

The OPFE 1110 may include, for example, an optical lens comprised of m (where m is a natural number) groups. The m lenses may move in the second direction Y to change the optical zoom ratio of the camera module 1100b. For example, when the basic optical zoom ratio of the camera module 1100b is Z, in the case in which m optical lenses included in the OPFE 1110 are moved, the optical zoom ratio of the camera module 1100b may be changed to 3Z, 5Z, or 5Z or higher optical zoom ratio.

The actuator 1130 may move the OPFE 1110 or an optical lens, (hereinafter, referred to as an optical lens), to a specific position. For example, the actuator 1130 may adjust the position of the optical lens such that the image sensor 1142 is positioned at a focal length of the optical lens for accurate sensing.

The image sensing device 1140 may include an image sensor 1142, a control logic 1144, and a memory 1146. The image sensor 1142 may sense an image of a sensing target using light L provided through an optical lens. The control logic 1144 may control the overall operation of the camera module 1100b. For example, the control logic 1144 may control the operation of the camera module 1100b according to a control signal provided through a control signal line CSLb.

The memory 1146 may store data required for the operation of the camera module 1100b, such as calibration data 1147. The calibration data 1147 may include data necessary for the camera module 1100b to generate image data using light L provided from an external source. The calibration data 1147 may include, for example, information on a degree of rotation described above, information on a focal length, information on an optical axis, and the like. For example, when the camera module 1100b is implemented in the form of a multi-state camera in which a focal length is changed depending on the position of the optical lens, the calibration data 1147 may include a focal length value for each position (or state) of the optical lens and data related to autofocusing.

The storage unit 1150 may store image data sensed through the image sensor 1142. The storage unit 1150 may be outside of the image sensing device 1140 and may be implemented in a form stacked with a sensor chip constituting the image sensing device 1140. In some embodiments, the storage unit 1150 may be implemented as an Electrically Erasable Programmable Read-Only Memory (EEPROM), but example embodiments of the present disclosure are not limited thereto.

Referring to FIGS. 33 and 34 together, in some example embodiments, each of the plurality of camera modules 1100a, 1100b, and 1100c may include the actuator 1130. Accordingly, each of the plurality of camera modules 1100a, 1100b, and 1100c may include the same or different calibration data 1147 according to the operation of the actuator 1130 included therein.

In some example embodiments, one camera module (e.g., 1100b) among the plurality of camera modules 1100a, 1100b and 1100c may be a folded lens type camera module including the prism 1105 and the OPFE 1110 described above, and the other camera modules (for example, 1100a, 1100b) may be vertical camera modules that does not include the prism 1105 and the OPFE 1110, but the example embodiments are not limited thereto.

In some example embodiments, one camera module (e.g., 1100c) among the plurality of camera modules 1100a, 1100b and 1100c may be a vertical type of depth camera for extracting depth data using, for example, Infrared Ray (IR). In this case, the application processor 1200 may merge image data provided from the depth camera with image data provided from another camera module (for example, 1100a or 1100b), thereby generating a 3D depth image.

In some example embodiments, at least two camera modules (e.g., 1100a and 1100b) among the plurality of camera modules 1100a, 1100b, and 1100c may have different fields of view. In this case, for example, optical lenses of at least two camera modules (e.g., 1100a and 1100b) among the plurality of camera modules 1100a, 1100b, and 1100c may be different from each other, but the configuration is not limited thereto.

In addition, in some example embodiments, fields of view of the plurality of camera modules 1100a, 1100b, and 1100c may be different from each other. In this case, the optical lenses included in the plurality of respective camera modules 1100a, 1100b, and 1100c may also be different from each other, but the configurations thereof are not limited thereto.

In some example embodiments, the plurality of camera modules 1100a, 1100b, and 1100c may be disposed to be physically separated from each other. For example, the sensing area of one image sensor 1142 is not divided and used by the plurality of camera modules 1100a, 1100b, and 1100c, but an independent image sensor 1142 may be inside of each of the plurality of camera modules 1100a, 1100b, and 1100c.

Referring back to FIG. 33, the application processor 1200 may include an image processing device 1210, a memory controller 1220, and an internal memory 1230. The application processor 1200 may be implemented separately from the plurality of camera modules 1100a, 1100b, and 1100c. For example, the application processor 1200 and the plurality of camera modules 1100a, 1100b, and 1100c may be implemented by being separated from each other as separate semiconductor chips.

The image processing device 1210 may include a plurality of sub-image processors 1212a, 1212b and 1212c, an image generator 1214, and a camera module controller 1216.

The image processing device 1210 may include the plurality of sub-image processors 1212a, 1212b, and 1212c corresponding to the number of the plurality of camera modules 1100a, 1100b, and 1100c.

Image data generated from the camera modules 1100a, 1100b, and 1100c, respectively, may be provided to the corresponding sub-image processors 1212a, 1212b, and 1212c through image signal lines ISLa, ISLb, and ISLc separated from each other. For example, image data generated from the camera module 1100a may be provided to the sub-image processor 1212a through the image signal line ISLa, the image data generated from the camera module 1100b may be provided to the sub-image processor 1212b through the image signal line ISLb, and the image data generated from the camera module 1100c may be provided to the sub-image processor 1212c through the image signal line ISLc. Such image data transmission may be performed using, for example, a camera serial interface (CSI) based on a Mobile Industry Processor Interface (MIPI), but example embodiments are not limited thereto.

On the other hand, in some embodiments, one sub-image processor may be arranged to correspond to a plurality of camera modules. For example, the sub-image processor 1212a and the sub-image processor 1212c are not implemented separately from each other as illustrated, but may be implemented by being integrated into one sub-image processor. In this case, image data provided from the camera module 1100a and the camera module 1100c may be selected through a selection element (e.g., a multiplexer) or the like, and then be provided to the integrated sub-image processor.

Image data provided to the respective sub-image processors 1212a, 1212b, and 1212c may be provided to the image generator 1214. The image generator 1214 may generate an output image using image data provided from the respective sub-image processors 1212a, 1212b, and 1212c according to the image generation data or a mode signal.

In greater detail, the image generator 1214 may merge at least portions of the image data generated from the camera modules 1100a, 1100b, and 1100c having different fields of view and may generate an output image, according to the image generation data or the mode signal. In addition, the image generator 1214 may generate an output image by selecting any one of image data generated from the camera modules 1100a, 1100b, and 1100c having different fields of view according to image generation data or the mode signal.

In some example embodiments, the image generation data may include a zoom signal or zoom factor. Further, in some example embodiments, the mode signal may be, for example, a signal based on a mode selected by a user.

For example, when the image generation data is a zoom signal (zoom factor) and the camera modules 1100a, 1100b and 1100c have different fields of view (viewing angles), the image generator 1214 may operate differently depending on the type of the zoom signal. For example, when the zoom signal is a first signal, after merging the image data output by the camera module 1100a and the image data output by the camera module 1100c, an output image may be generated using the merged image signal and image data output by the camera module 1100b that is not used for merging. For example, in a case in which the zoom signal is a second signal different from the first signal, the image generator 1214 does not perform such image data merging, and may select any one of the image data output by the camera modules 1100a, 1100b and 1100c and may generate an output image. However, example embodiments are not limited thereto, and a method of processing image data may be variously modified and implemented as needed.

In some embodiments, the image generator 1214 may receive a plurality of image data having different exposure times, from at least one of the plurality of sub-image processors 1212a, 1212b and 1212c, and may perform high dynamic range (HDR) processing for the plurality of image data, thereby generating merged image data having an increased dynamic range.

The camera module controller 1216 may provide a control signal to the respective camera modules 1100a, 1100b, and 1100c. The control signal generated by the camera module controller 1216 may be provided to the corresponding camera modules 1100a, 1100b, and 1100c through control signal lines CSLa, CSLb, and CSLc separated from each other.

Any one of the plurality of camera modules 1100a, 1100b and 1100c may be designated as a master camera (e.g., 1100b) according to image generation data including a zoom signal or a mode signal, and the remaining camera modules (e.g., 1100a and 1100c) may be designated as slave cameras. This data may be included in the control signal and be provided to the corresponding camera modules 1100a, 1100b, and 1100c through the control signal lines CSLa, CSLb, and CSLc separated from each other.

Camera modules operating as masters and slaves may be changed according to a zoom factor or an operation mode signal. For example, when the field of view of the camera module 1100a is wider than that of the camera module 1100b and the zoom factor thereof provides a relatively low zoom ratio, the camera module 1100b may operate as a master, and the camera module 1100a may operate as a slave. Conversely, when the zoom factor provides a relatively high zoom ratio, the camera module 1100a may operate as a master and the camera module 1100b may operate as a slave.

In some example embodiments, a control signal provided from the camera module controller 1216 to the respective camera modules 1100a, 1100b, and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b receiving the sync enable signal generates a sync signal based on the received sync enable signal, and may transmit the generated sync signal to the camera modules 1100a and 1100c through a sync signal line SSL. The camera module 1100b and the camera modules 1100a and 1100c may be synchronized with this sync signal to transmit image data to the application processor 1200.

In some example embodiments, a control signal provided from the camera module controller 1216 to the plurality of camera modules 1100a, 1100b, and 1100c may include mode data based on the mode signal. Based on this mode data, the plurality of camera modules 1100a, 1100b, and 1100c may operate in a first operation mode and a second operation mode in relation to the sensing speed.

In the first operation mode, the plurality of camera modules 1100a, 1100b, and 1100c may generate an image signal at a first rate (for example, generate an image signal at a first frame rate), and may encode the generated image signal at a second rate higher than the first rate (for example, encode an image signal having a second frame rate higher than the first frame rate), and may transmit the encoded image signal to the application processor 1200. In this case, the second speed may be 30 times or less of the first speed.

The application processor 1200 stores the received image signal, for example, the encoded image signal, in a memory 1230 provided therein or in a storage 1400 outside of the application processor 1200, and then, may read the encoded image signal from the memory 1230 or the storage 1400 and decode the read signal, and may display image data generated based on the decoded image signal. For example, a corresponding subprocessor among the plurality of subprocessors 1212a, 1212b, and 1212c of the image processing device 1210 may perform decoding, and may also perform image processing on the decoded image signal.

The plurality of camera modules 1100a, 1100b, and 1100c may generate an image signal at a third rate lower than the first rate in the second operation mode, (for example, generate an image signal having a third frame rate lower than the first frame rate), and may transmit the image signal to the application processor 1200. The image signal provided to the application processor 1200 may be an unencoded signal. The application processor 1200 may perform image processing on the received image signal or may store the image signal in the memory 1230 or the storage 1400.

The PMIC 1300 may supply power, such as a power supply voltage, to the plurality of respective camera modules 1100a, 1100b, and 1100c. For example, under the control of the application processor 1200, the PMIC 1300 may supply first power to the camera module 1100a through a power signal line PSLa, supply second power to the camera module 1100b through a power signal line PSLb, and supply third power to the camera module 1100c through a power signal line PSLc.

The PMIC 1300 generates power corresponding to each of the plurality of camera modules 1100a, 1100b, and 1100c in response to a power control signal PCON from the application processor 1200, and may also adjust the power level. The power control signal PCON may include a power adjustment signal for each operation mode of the plurality of camera modules 1100a, 1100b, and 1100c. For example, the operation mode may include a low power mode, and in this case, the power control signal PCON may include data on a camera module operating in a low power mode and a set power level. Levels of power signals provided to the plurality of camera modules 1100a, 1100b, and 1100c, respectively, may be the same as or different from each other. Also, the level of power signals may be dynamically changed.

As set forth above, an image sensor according to some example embodiments may have an effect of generating an image having high or higher sensitivity while providing autofocusing and distance data, in all pixels.

In addition, since there may be no need to separate a photodiode within one pixel, there is an effect of enabling miniaturization. In addition, since a distance between pixels for providing distance data and autofocusing may be secured, there is a clear phase separation effect by light.

In addition, distance data may be provided in all directions, and an image having a relatively high or higher resolution may be generated according to an operation mode, or an image having significantly increased sensitivity through an impurity region may be generated.

While some example embodiments have been illustrated and described above, it will be apparent to those skilled in the art that modifications and variations could be made without departing from the scope of the present inventive concepts as defined by the appended claims.

What is claimed is:

1. An image sensor comprising:
   a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels of each of the plurality of pixel groups including color filters of the same color; and
   a control logic configured to group the plurality of unit pixels of each of the plurality of pixel groups into a plurality of subgroups and to drive the pixel array for each subgroup,
   wherein for each of the plurality of pixel groups the plurality of subgroups include a first subgroup and a second subgroup,
   wherein the control logic is configured to obtain first image data corresponding to the first subgroup and second image data corresponding to the second subgroup; and
   wherein the first subgroup and the second subgroup are provided with at least one unit pixel therebetween in the first direction or the second direction.

2. The image sensor of claim 1, further comprising a signal processing circuit configured to calculate a disparity by using the first image data and the second image data, and configured to provide at least one of an autofocusing function and distance data based on the disparity.

3. The image sensor of claim 2, wherein the control logic is configured to acquire image data from each of the plurality of unit pixels.

4. The image sensor of claim 3, wherein the signal processing circuit is configured to generate the first image data and the second image data by using the image data obtained from each of the plurality of unit pixels.

5. The image sensor of claim 1, wherein for each of the plurality of pixel groups, the plurality of subgroups includes a third subgroup between the first subgroup and the second subgroup, and
   the control logic is configured to acquire third image data corresponding to the third subgroup.

6. The image sensor of claim 5, further comprising a signal processing circuit configured to calculate a disparity by using the first image data and the second image data, and configured to provide at least one of an autofocusing function and distance data based on the disparity.

7. The image sensor of claim 5, further comprising a signal processing circuit configured to generate image data for one pixel group by using the first image data, the second image data, and the third image data.

8. The image sensor of claim 1, wherein each of the plurality of pixel groups includes one floating diffusion region and a plurality of photodiodes that share the one floating diffusion region, wherein a number of the plurality of photodiodes is equal as a number of the plurality of unit pixels.

9. The image sensor of claim 8, wherein the control logic is configured to read a first pixel voltage corresponding to an amount of electric charges generated by first photodiodes included in the first subgroup and accumulated in the one floating diffusion region, and configured to obtain the first image data from the first pixel voltage, and wherein the control logic is configured to read a second pixel voltage corresponding to an amount of electric charges generated by second photodiodes included in the second subgroup, and accumulated in the one floating diffusion region, and configured to obtain the second image data from the second pixel voltage.

10. The image sensor of claim 1, wherein each of the plurality of pixel groups includes a plurality of photodiodes and a plurality of floating diffusion regions, wherein in each of the plurality of pixel groups, at least portions of the plurality of photodiodes are connected to different floating diffusion regions.

11. The image sensor of claim 10, wherein the control logic is configured to detect reset voltages and pixel voltages corresponding to electric charges generated by photodiodes connected to different floating diffusion regions from among first photodiodes included in the first subgroup, and configured to acquire the first image data from a sum of the reset voltages and a sum of the pixel voltages.

12. An image sensor comprising:

a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels in each of the plurality of pixel groups including color filters of the same color; and a control logic configured to group the plurality of unit pixels in each of the plurality of pixel groups into a plurality of subgroups and configured to adjust differently on and off timings for a plurality of transfer transistors included in the unit pixels for each subgroup, wherein in each of the plurality of pixel groups, the plurality of subgroups include a first subgroup and a second subgroup, and wherein the first subgroup and the second subgroup are provided with at least one unit pixel therebetween in the first direction or the second direction.

13. The image sensor of claim 12, wherein the control logic is configured to obtain image data from each of the plurality of unit pixels.

14. The image sensor of claim 12, wherein the control logic is configured to simultaneously turn first transfer transistors included in the first subgroup on and off using a first on-off timing, and is configured to simultaneously turn second transfer transistors included in the second subgroup on and off using a second on-off timing different from the first on-off timing.

15. The image sensor of claim 14, wherein for each of the plurality of pixel groups, the plurality of subgroups includes a third subgroup, wherein among the plurality of transfer transistors, third transfer transistors included in the third subgroup are simultaneously turned on and off using a third on-off timing that is different from the first on-off timing and the second on-off timing.

16. The image sensor of claim 12, wherein during a first frame period, the image sensor is configured to operate in a first operation mode, and the control logic is configured to adjust differently on and off timings of the plurality of transfer transistors in each of the plurality of pixel groups, and during a second frame period after the first frame period, the image sensor is configured to operate in a second operation mode, and the control logic is configured to simultaneously turn first transfer transistors included in the first subgroup on and off using a first on-off timing and configured to simultaneously turn second transfer transistors included in the second subgroup on and off using a second on-off timing different from the first on-off timing.

17. The image sensor of claim 16, wherein the control logic is configured to acquire image data from each of the plurality of unit pixels in the first operation mode.

18. The image sensor of claim 16, wherein each of the plurality of pixel groups includes one floating diffusion region and a plurality of photodiodes sharing the one floating diffusion region, and wherein the control logic is configured to read a first pixel voltage corresponding to an amount of electric charges generated by first photodiodes included in the first subgroup and accumulated in the one floating diffusion region, and configured to obtain first image data from the first pixel voltage, in the second operation mode, and wherein the control logic is configured to read a second pixel voltage corresponding to an amount of electric charges generated by second photodiodes included in the second subgroup and accumulated in the one floating diffusion region, and configured to obtain second image data from the second pixel voltage.

19. The image sensor of claim 18, further comprising a signal processing circuit configured to calculate a disparity by using the first image data and the second image data and to provide at least one of an autofocusing function and distance data based on the disparity.

20. An image sensor comprising:

a pixel array including a plurality of pixel groups arranged in a first direction and a second direction that intersects the first direction, each of the plurality of pixel groups including a plurality of unit pixels arranged in the first direction and the second direction and sharing a single microlens, the plurality of unit pixels in each of the plurality of pixel groups including color filters of the same color; and a control logic configured to group the plurality of unit pixels of each of the plurality of pixel groups into a plurality of subgroups and to drive the pixel array for each subgroup, wherein in each of the plurality of pixel groups, a first device isolation layer is between the plurality of unit pixels, wherein in each of the plurality of pixel groups, the plurality of subgroups include a first subgroup and a second subgroup, wherein the first subgroup and the second subgroup are provided with at least one unit pixel therebetween in the first direction or the second direction, and wherein each of the plurality of pixel groups includes a plurality of photodiodes, and an impurity region is provided between the plurality of photodiodes.

* * * * *